United States Patent
Riemer et al.

(10) Patent No.: US 11,664,539 B2
(45) Date of Patent: *May 30, 2023

(54) DUAL SIDED REUSABLE BATTERY INDICATOR

(71) Applicant: DURACELL U.S. OPERATIONS, INC., Wilmington, DE (US)

(72) Inventors: Joern Riemer, Santa Clara, CA (US); Robert Pavlinsky, Oxford, CT (US); Jordan Bourilkov, Bethany, CT (US); Steven J. Specht, Brookfield, CT (US); George Turco, Wilimington, DE (US); Sergio Coronado, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 111 days.

This patent is subject to a terminal disclaimer.

(21) Appl. No.: 17/135,759

(22) Filed: Dec. 28, 2020

(65) Prior Publication Data

US 2021/0119270 A1 Apr. 22, 2021

Related U.S. Application Data

(63) Continuation of application No. 16/834,827, filed on Mar. 30, 2020, now Pat. No. 11,024,892, which is a
(Continued)

(51) Int. Cl.
*H01M 10/42* (2006.01)
*G01R 31/371* (2019.01)
(Continued)

(52) U.S. Cl.
CPC ........ *H01M 10/425* (2013.01); *G01R 31/371* (2019.01); *G01R 31/3835* (2019.01);
(Continued)

(58) Field of Classification Search
CPC .... E05B 17/0075; G05D 1/00; G05D 1/0212; G05D 1/0291; G01N 33/00;
(Continued)

(56) References Cited

U.S. PATENT DOCUMENTS 3,354,565 A 11/1967 Emmons et al.
3,992,228 A 11/1976 Depoix
(Continued)

FOREIGN PATENT DOCUMENTS

CN 1084281 A 3/1994
CN 1163020 A 10/1997
(Continued)

OTHER PUBLICATIONS

Chinese Patent Application No. 201780068058.1, Office Action and Search Report, dated Jan. 20, 2022.
(Continued)

*Primary Examiner* — Anthony R Jimenez
(74) *Attorney, Agent, or Firm* — Marshall, Gerstein & Borun LLP

(57) ABSTRACT

A reusable battery indicator comprises a voltage sensor configured to convert sensed analog characteristics of a battery to digital information; a communication circuit communicatively connected to the voltage sensor; an antenna operatively coupled to the communication circuit; and a connection mechanism having at least a first connector and a second connector that are electrically connected to the voltage sensor, the first connector and the second connector being adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal.

21 Claims, 9 Drawing Sheets

Related U.S. Application Data continuation of application No. 15/340,757, filed on Nov. 1, 2016, now Pat. No. 10,608,293.

(51) Int. Cl.
| | |
|---|---|
| *G01R 31/3835* | (2019.01) |
| *H04W 4/70* | (2018.01) |
| *H04L 67/125* | (2022.01) |
| *H01M 10/48* | (2006.01) |

(52) U.S. Cl.
CPC ....... *H01M 10/4285* (2013.01); *H01M 10/48* (2013.01); *H04L 67/125* (2013.01); *H04W 4/70* (2018.02); *H01M 10/486* (2013.01); *H01M 2010/4278* (2013.01)

(58) Field of Classification Search
CPC ......... G01N 33/0063; B60S 5/00; B60Q 9/00; B60W 60/001; B60W 2510/246; G01R 31/396; G01R 31/382; G01R 31/371; G01R 31/3835; H01M 10/00; H01M 10/482; H01M 10/486; H01M 10/613; H01M 10/625; H01M 10/633; H01M 10/6567; H01M 2220/20; H01M 10/42; H01M 10/48; B60L 50/64; B60L 58/26; G08C 17/00; H04W 4/70; H04L 67/125
USPC .......................................................... 701/22
See application file for complete search history.

(56) References Cited

U.S. PATENT DOCUMENTS

| | | | |
|---|---|---|---|
| 3,993,985 A | 11/1976 | Chopard et al. | |
| 4,117,475 A | 9/1978 | Ebihara et al. | |
| 4,149,146 A | 4/1979 | Ebihara et al. | |
| 4,238,554 A | 12/1980 | Barrella | |
| 4,302,751 A | 11/1981 | Nakauchi et al. | |
| 4,460,870 A | 7/1984 | Finger | |
| 4,482,615 A | 11/1984 | Rosansky et al. | |
| 4,598,243 A | 7/1986 | Kawakami | |
| 4,654,280 A | 3/1987 | Bailey | |
| 4,723,656 A | 2/1988 | Kiernan et al. | |
| 4,759,765 A | 7/1988 | Van Kampen | |
| 4,808,497 A | 2/1989 | Blomgren et al. | |
| 4,860,185 A | 8/1989 | Brewer et al. | |
| 4,952,330 A | 8/1990 | Leger et al. | |
| 5,015,544 A | 5/1991 | Burroughs et al. | |
| 5,032,825 A | 7/1991 | Kuznicki | |
| 5,188,231 A | 2/1993 | Kivell et al. | |
| 5,200,686 A | 4/1993 | Lee | |
| 5,219,683 A | 6/1993 | Webber | |
| 5,231,356 A | 7/1993 | Parker | |
| 5,250,905 A | 10/1993 | Kuo et al. | |
| 5,290,414 A | 3/1994 | Marple | |
| 5,339,024 A | 8/1994 | Kuo et al. | |
| 5,355,089 A | 10/1994 | Treger | |
| 5,366,832 A | 11/1994 | Hayashi et al. | |
| 5,389,458 A | 2/1995 | Weiss et al. | |
| 5,389,470 A | 2/1995 | Parker et al. | |
| 5,396,177 A | 3/1995 | Kuo et al. | |
| 5,418,085 A | 5/1995 | Huhndorff et al. | |
| 5,418,086 A | 5/1995 | Bailey | |
| 5,424,722 A | 6/1995 | Inada et al. | |
| 5,438,607 A | 8/1995 | Przygoda, Jr. et al. | |
| 5,449,570 A | 9/1995 | Inkmann et al. | |
| 5,458,992 A | 10/1995 | Bailey | |
| 5,458,997 A | 10/1995 | Crespi et al. | |
| 5,491,038 A | 2/1996 | DePalma et al. | |
| 5,494,496 A | 2/1996 | Huhndorff et al. | |
| 5,514,491 A | 5/1996 | Webber | |
| 5,525,439 A | 6/1996 | Huhndorff et al. | |
| 5,543,246 A | 8/1996 | Treger | |
| 5,569,556 A | 10/1996 | Bohmer | |
| 5,587,573 A | 12/1996 | Owen et al. | |
| 5,596,278 A | 1/1997 | Lin | |
| 5,607,790 A | 3/1997 | Hughen et al. | |
| 5,626,984 A | 5/1997 | Albini | |
| 5,627,472 A | 5/1997 | Ofer et al. | |
| 5,633,592 A | 5/1997 | Lang | |
| 5,640,150 A | 6/1997 | Atwater | |
| 5,654,640 A | 8/1997 | Bailey | |
| 5,691,083 A | 11/1997 | Bolster | |
| 5,737,114 A | 4/1998 | Bailey | |
| 5,786,106 A | 7/1998 | Armani | |
| 5,798,933 A | 8/1998 | Nicolai | |
| 5,849,046 A | 12/1998 | Bailey | |
| 5,925,479 A | 7/1999 | Wei et al. | |
| 5,959,568 A | 9/1999 | Woolley | |
| 5,963,012 A | 10/1999 | Garcia et al. | |
| 6,014,014 A | 1/2000 | Owen et al. | |
| 6,084,523 A | 7/2000 | Gelnovatch et al. | |
| 6,127,062 A | 10/2000 | Sargeant et al. | |
| 6,143,439 A | 11/2000 | Yoppolo et al. | |
| 6,156,450 A | 12/2000 | Bailey | |
| 6,169,397 B1 | 1/2001 | Steinbach et al. | |
| 6,171,729 B1 | 1/2001 | Gan et al. | |
| 6,184,656 B1* | 2/2001 | Karunasiri | B60L 3/0046 342/442 |
| 6,208,235 B1 | 3/2001 | Trontelj | |
| 6,218,054 B1 | 4/2001 | Webber | |
| 6,252,377 B1 | 6/2001 | Shibutani et al. | |
| 6,275,161 B1 | 8/2001 | Wan et al. | |
| 6,300,004 B1 | 10/2001 | Tucholski | |
| 6,407,534 B1 | 6/2002 | Mukainakano | |
| 6,469,471 B1 | 10/2002 | Anbuky et al. | |
| 6,483,275 B1 | 11/2002 | Nebrigic et al. | |
| 6,587,250 B2 | 7/2003 | Armgarth et al. | |
| 6,617,069 B1 | 9/2003 | Hopper et al. | |
| 6,617,072 B2 | 9/2003 | Venkatesan et al. | |
| 6,627,353 B1 | 9/2003 | Munshi | |
| 6,670,073 B2 | 12/2003 | Tucholski et al. | |
| RE38,518 E | 5/2004 | Tucholski | |
| 6,730,136 B2 | 5/2004 | Webber | |
| 6,774,685 B2 | 8/2004 | O'Toole et al. | |
| 6,775,562 B1 | 8/2004 | Owens et al. | |
| 6,849,360 B2 | 2/2005 | Marple | |
| 6,979,502 B1 | 12/2005 | Gartstein et al. | |
| 6,990,171 B2 | 1/2006 | Toth et al. | |
| 7,067,882 B2 | 6/2006 | Singh | |
| 7,079,079 B2 | 7/2006 | Jo et al. | |
| 7,157,185 B2 | 1/2007 | Marple | |
| 7,181,164 B2* | 2/2007 | Lee | H04B 5/02 340/12.32 |
| 7,386,404 B2 | 6/2008 | Cargonja et al. | |
| 7,474,230 B2 | 1/2009 | Blom et al. | |
| 7,489,431 B2 | 2/2009 | Malmstrom et al. | |
| 7,511,454 B1 | 3/2009 | Legg | |
| 7,561,050 B2 | 7/2009 | Bhogal et al. | |
| 7,576,517 B1 | 8/2009 | Cotton et al. | |
| 7,586,416 B2 | 9/2009 | Ariyoshi et al. | |
| 7,598,880 B2 | 10/2009 | Powell et al. | |
| 7,606,530 B1 | 10/2009 | Anderson et al. | |
| 7,715,884 B2 | 5/2010 | Book et al. | |
| 7,741,970 B2 | 6/2010 | Cunningham et al. | |
| 7,745,046 B2 | 6/2010 | Kim et al. | |
| 7,768,236 B2 | 8/2010 | Takamura et al. | |
| 7,772,850 B2 | 8/2010 | Bertness | |
| 7,805,263 B2 | 9/2010 | Mack | |
| 7,911,182 B2 | 3/2011 | Cargonja et al. | |
| 7,944,368 B2 | 5/2011 | Carter et al. | |
| 8,031,054 B2 | 10/2011 | Tuttle | |
| 8,106,845 B2 | 1/2012 | Savry | |
| 8,119,286 B2 | 2/2012 | Issaev et al. | |
| 8,131,486 B2 | 3/2012 | Leonard et al. | |
| 8,344,685 B2 | 1/2013 | Bertness et al. | |
| 8,368,356 B2 | 2/2013 | Nakashima et al. | |
| 8,374,507 B2 | 2/2013 | Hudson et al. | |
| 8,424,092 B2 | 4/2013 | Ikeuchi et al. | |
| 8,427,109 B2 | 4/2013 | Melichar | |
| 8,471,888 B2 | 6/2013 | George et al. | |
| 8,478,552 B2 | 7/2013 | Morita et al. | |
| 8,652,670 B2 | 2/2014 | Uchida | |
| 8,653,926 B2 | 2/2014 | Detcheverry et al. | |

(56) References Cited

U.S. PATENT DOCUMENTS

| | | |
|---|---|---|
| 8,900,731 B2 | 12/2014 | Bohne |
| 8,901,888 B1 | 12/2014 | Beckman |
| 8,905,317 B1 | 12/2014 | Hsu et al. |
| 9,037,426 B2 | 5/2015 | Schaefer |
| 9,060,213 B2 | 6/2015 | Jones |
| 9,076,092 B2 | 7/2015 | Ritamaki et al. |
| 9,083,063 B2 | 7/2015 | Specht et al. |
| 9,146,595 B2 | 9/2015 | Forutanpour et al. |
| 9,167,317 B2 | 10/2015 | DeMar |
| 9,189,667 B2 | 11/2015 | Bourilkov et al. |
| 9,235,044 B2 | 1/2016 | Specht et al. |
| 9,297,859 B2 | 3/2016 | Mukaitani et al. |
| 9,312,575 B2 | 4/2016 | Stukenberg et al. |
| 9,331,378 B2 | 5/2016 | Merlin et al. |
| 9,415,499 B2 | 8/2016 | Brotto et al. |
| 9,425,487 B2 | 8/2016 | Bertness |
| 9,453,885 B2 | 9/2016 | Mukaitani et al. |
| 9,459,323 B2 | 10/2016 | Mukaitani et al. |
| 9,461,339 B2 | 10/2016 | Roohparvar |
| 9,478,850 B2 | 10/2016 | Bourilkov et al. |
| 9,515,303 B2 | 12/2016 | Lee et al. |
| 9,551,758 B2 | 1/2017 | Bourilkov et al. |
| 9,568,556 B2 | 2/2017 | Bourilkov et al. |
| 9,619,612 B2 | 4/2017 | Kallfelz et al. |
| 9,639,724 B2 | 5/2017 | Bourilkov et al. |
| 9,661,576 B2 | 5/2017 | Tomisawa |
| 9,699,818 B2 | 7/2017 | Grothaus et al. |
| 9,726,763 B2 | 8/2017 | Dempsey et al. |
| 9,739,837 B2 | 8/2017 | Bourilkov et al. |
| 9,746,524 B2 | 8/2017 | Petrucelli |
| 9,774,210 B1 | 9/2017 | Wright |
| 9,823,310 B2 | 11/2017 | Bourilkov et al. |
| 9,841,462 B2 | 12/2017 | Kim et al. |
| 9,843,220 B2 | 12/2017 | Herrmann et al. |
| 9,869,726 B2 | 1/2018 | Zumstein et al. |
| 9,882,250 B2 | 1/2018 | Chappelle et al. |
| 9,887,463 B2 | 2/2018 | Bourilkov et al. |
| 9,893,390 B2 | 2/2018 | Specht et al. |
| 9,983,312 B2 | 5/2018 | Dempsey et al. |
| 10,094,886 B2 | 10/2018 | Bourilkov et al. |
| 10,151,802 B2 | 12/2018 | Riemer et al. |
| 10,184,988 B2 | 1/2019 | Bourilkov et al. |
| 10,297,875 B2 | 5/2019 | Riemer et al. |
| 10,416,309 B2 | 9/2019 | Dempsey et al. |
| 10,483,634 B2 | 11/2019 | Bourilkov et al. |
| 10,608,293 B2 * | 3/2020 | Riemer ............... H01M 10/425 |
| 2001/0005123 A1 | 6/2001 | Jones et al. |
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2002/0193955 A1 | 12/2002 | Bertness et al. |
| 2003/0070283 A1 | 4/2003 | Webber |
| 2003/0124417 A1 | 7/2003 | Bertness et al. |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0036657 A1 | 2/2004 | Forster et al. |
| 2004/0048512 A1 | 3/2004 | Chen |
| 2004/0183742 A1 | 9/2004 | Goff et al. |
| 2004/0189256 A1 | 9/2004 | Sink |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0258797 A1 | 11/2005 | Hung |
| 2005/0277023 A1 | 12/2005 | Marple et al. |
| 2006/0017581 A1 | 1/2006 | Schwendinger et al. |
| 2006/0028179 A1 | 2/2006 | Yudahira et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detecheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0048609 A1 * | 2/2008 | Kuhlmann ............ H02J 7/0042 |
| | | 320/107 |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1 | 7/2008 | Toya et al. |
| 2008/0206627 A1 | 8/2008 | Wright |
| 2008/0218351 A1 | 9/2008 | Corrado et al. |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1 | 7/2009 | Sheng |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1 | 11/2009 | Trinkle |
| 2009/0297949 A1 | 12/2009 | Berkowitz et al. |
| 2009/0308936 A1 | 12/2009 | Nitzan et al. |
| 2009/0309545 A1 | 12/2009 | Kunimitsu |
| 2010/0019733 A1 | 1/2010 | Rubio |
| 2010/0030592 A1 | 2/2010 | Evans et al. |
| 2010/0073003 A1 | 3/2010 | Sakurai et al. |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0295943 A1 | 11/2010 | Cha et al. |
| 2010/0308974 A1 | 12/2010 | Rowland et al. |
| 2011/0018777 A1 | 1/2011 | Brown |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1 | 3/2013 | Madhyastha et al. |
| 2013/0117595 A1 | 5/2013 | Murawski et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |

(56) References Cited

U.S. PATENT DOCUMENTS

| | | |
|---|---|---|
| 2013/0164567 A1 | 6/2013 | Olsson et al. |
| 2013/0171479 A1 | 7/2013 | Kim et al. |
| 2013/0183568 A1 | 7/2013 | Babinec et al. |
| 2013/0185008 A1 | 7/2013 | Itabashi et al. |
| 2013/0244062 A1 | 9/2013 | Teramoto et al. |
| 2013/0271072 A1 | 10/2013 | Lee et al. |
| 2013/0295421 A1 | 11/2013 | Teramoto et al. |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0176141 A1 | 6/2014 | Takatsuji |
| 2014/0188413 A1 | 7/2014 | Bourilkov et al. |
| 2014/0197802 A1 | 7/2014 | Yamazaki |
| 2014/0229129 A1 | 8/2014 | Campbell et al. |
| 2014/0302348 A1 | 10/2014 | Specht et al. |
| 2014/0302351 A1 | 10/2014 | Specht et al. |
| 2014/0320144 A1 | 10/2014 | Nakaya |
| 2014/0342193 A1 | 11/2014 | Mull et al. |
| 2014/0346873 A1 | 11/2014 | Colangelo et al. |
| 2014/0347249 A1 | 11/2014 | Bourilkov et al. |
| 2014/0370344 A1 | 12/2014 | Lovelace et al. |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0072181 A1 | 3/2015 | Roohparvar |
| 2015/0162649 A1 | 6/2015 | Bae et al. |
| 2015/0349391 A1 | 12/2015 | Chappelle et al. |
| 2015/0357685 A1 | 12/2015 | Iwasawa et al. |
| 2016/0034733 A1 | 2/2016 | Bourilkov et al. |
| 2016/0049695 A1 | 2/2016 | Lim et al. |
| 2016/0064781 A1 | 3/2016 | Specht et al. |
| 2016/0092847 A1 | 3/2016 | Buchbinder |
| 2016/0137088 A1 | 5/2016 | Lim et al. |
| 2016/0154025 A1 | 6/2016 | Song et al. |
| 2016/0277879 A1 | 9/2016 | Daoura et al. |
| 2017/0040698 A1 | 2/2017 | Bourilkov et al. |
| 2017/0062841 A1 | 3/2017 | Riemer et al. |
| 2017/0062880 A1 | 3/2017 | Riemer et al. |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1 | 5/2018 | Riemer et al. |
| 2018/0123174 A1 | 5/2018 | Riemer et al. |
| 2018/0123175 A1 | 5/2018 | Riemer et al. |
| 2018/0123176 A1 | 5/2018 | Riemer et al. |
| 2018/0123233 A1 | 5/2018 | Bourilkov et al. |
| 2018/0159225 A1 | 6/2018 | Bourilkov et al. |
| 2019/0113579 A1 | 4/2019 | Riemer et al. |
| 2019/0137572 A1 | 5/2019 | Bourilkov et al. |
| 2020/0011997 A1 | 1/2020 | Dempsey et al. |

FOREIGN PATENT DOCUMENTS

| | | |
|---|---|---|
| CN | 1228540 A | 9/1999 |
| CN | 1279826 A | 1/2001 |
| CN | 1315072 A | 9/2001 |
| CN | 1529182 A | 9/2004 |
| CN | 2828963 Y | 10/2006 |
| CN | 101023369 A | 8/2007 |
| CN | 101126795 A | 2/2008 |
| CN | 201142022 Y | 10/2008 |
| CN | 201227812 Y | 4/2009 |
| CN | 201233435 Y | 5/2009 |
| CN | 101552363 A | 10/2009 |
| CN | 101702792 A | 5/2010 |
| CN | 101785164 A | 7/2010 |
| CN | 102017288 A | 4/2011 |
| CN | 102097844 A | 6/2011 |
| CN | 102142186 A | 8/2011 |
| CN | 102544709 A | 7/2012 |
| CN | 202308203 U | 7/2012 |
| CN | 202720320 U | 2/2013 |
| CN | 202856390 U | 4/2013 |
| CN | 103682482 A | 3/2014 |
| CN | 204011808 U | 12/2014 |
| CN | 104427037 A | 3/2015 |
| CN | 104635169 A | 5/2015 |
| CN | 204538140 U | 8/2015 |
| CN | 104953153 A | 9/2015 |
| CN | 105337367 A | 2/2016 |
| CN | 205160145 U | 4/2016 |
| CN | 106405241 A | 2/2017 |
| CN | 106848448 A | 6/2017 |
| CN | 107284272 A | 10/2017 |
| CN | 206804833 U | 12/2017 |
| DE | 10118027 A1 | 11/2002 |
| DE | 10118051 A1 | 11/2002 |
| EP | 0523901 A1 | 1/1993 |
| EP | 1450174 A1 | 8/2004 |
| EP | 1693807 A1 | 8/2006 |
| EP | 1786057 A2 | 5/2007 |
| EP | 1821363 A1 | 8/2007 |
| EP | 2065962 A1 | 6/2009 |
| EP | 2204873 A1 | 7/2010 |
| EP | 2324535 A1 | 5/2011 |
| EP | 2328223 A1 | 6/2011 |
| EP | 2645447 A1 | 10/2013 |
| EP | 2680093 A2 | 1/2014 |
| EP | 2790262 A1 | 10/2014 |
| EP | 3128599 A1 | 2/2017 |
| JP | S52005581 A | 1/1977 |
| JP | 61169781 | 7/1986 |
| JP | 02142324 | 5/1990 |
| JP | H03131771 A | 6/1991 |
| JP | H06-25888 Y2 | 7/1994 |
| JP | H06284170 A | 10/1994 |
| JP | H06511106 A | 12/1994 |
| JP | H07113855 A | 5/1995 |
| JP | H09005366 A | 1/1997 |
| JP | H0945298 A | 2/1997 |
| JP | 10014003 | 1/1998 |
| JP | 2000-067836 A | 3/2000 |
| JP | 2000077928 A | 3/2000 |
| JP | 2001022905 A | 1/2001 |
| JP | 200193510 A | 4/2001 |
| JP | 2003-264009 A | 9/2003 |
| JP | 2004-077480 A | 3/2004 |
| JP | 2004085580 A | 3/2004 |
| JP | 2004-253858 A | 9/2004 |
| JP | 2004-265722 A | 9/2004 |
| JP | 2004534430 A | 11/2004 |
| JP | 2005218174 A | 8/2005 |
| JP | 2005327099 A | 11/2005 |
| JP | 2006139544 A | 6/2006 |
| JP | 2006284431 A | 10/2006 |
| JP | 2006324074 A | 11/2006 |
| JP | 2007515848 A | 6/2007 |
| JP | 2007171045 A | 7/2007 |
| JP | 2007-214068 A | 8/2007 |
| JP | 2008042985 A | 2/2008 |
| JP | 2008-530682 A | 8/2008 |
| JP | 2008181855 A | 8/2008 |
| JP | 2009-37374 | 2/2009 |
| JP | 2010-092760 A | 4/2010 |
| JP | 2010098361 A | 4/2010 |
| JP | 2010-154012 A | 7/2010 |
| JP | 2011113759 A | 6/2011 |
| JP | 2011203595 A | 10/2011 |
| JP | 2012/0056002 A | 3/2012 |
| JP | 2012085491 A | 4/2012 |
| JP | 2012-124141 A | 6/2012 |
| JP | 2012-129183 A | 7/2012 |
| JP | 2012-146447 A | 8/2012 |
| JP | 2012161614 A | 8/2012 |
| JP | 2012-174376 A | 9/2012 |
| JP | 2012170262 A | 9/2012 |
| JP | 2013-038967 A | 2/2013 |
| JP | 2013038961 A | 2/2013 |

(56) References Cited

FOREIGN PATENT DOCUMENTS

| | | |
|---|---|---|
| JP | 2013120640 A | 6/2013 |
| JP | 2013-158148 A | 8/2013 |
| JP | 2014-203584 A | 10/2014 |
| JP | 2016-004627 A | 1/2016 |
| JP | 2016-518006 A | 6/2016 |
| KR | 890000323 A | 3/1989 |
| KR | 100928563 B1 | 11/2009 |
| KR | 2011-0018488 A | 2/2011 |
| TW | M510009 U | 10/2015 |
| TW | I580153 B | 4/2017 |
| WO | WO-95/01062 A1 | 1/1995 |
| WO | WO-03/047064 A2 | 6/2003 |
| WO | WO-2004/047215 A1 | 6/2004 |
| WO | WO-2004/107251 A2 | 12/2004 |
| WO | WO-2005/078673 A1 | 8/2005 |
| WO | WO-2006/048838 A1 | 5/2006 |
| WO | WO-2006/085291 A2 | 8/2006 |
| WO | WO-2008/151181 A1 | 12/2008 |
| WO | WO-2008/156735 A1 | 12/2008 |
| WO | WO-2009/107597 A1 | 9/2009 |
| WO | WO-2010/127509 A1 | 11/2010 |
| WO | WO-2011/063679 A1 | 6/2011 |
| WO | WO-2011/096863 A1 | 8/2011 |
| WO | WO-2012/051272 A2 | 4/2012 |
| WO | WO-2012/061262 A1 | 5/2012 |
| WO | WO-2012/070632 A1 | 5/2012 |
| WO | WO-2012/070635 A1 | 5/2012 |
| WO | WO-2012/083759 A1 | 6/2012 |
| WO | WO-2013/022857 A2 | 2/2013 |
| WO | WO-2013/024341 A1 | 2/2013 |
| WO | WO-2013/069423 A1 | 5/2013 |
| WO | WO-2013/084481 A1 | 6/2013 |
| WO | WO-2013/101652 A1 | 7/2013 |
| WO | WO-2015/066626 A1 | 5/2015 |
| WO | WO-2015/183609 A1 | 12/2015 |
| WO | WO-2016/146006 A1 | 9/2016 |
| WO | WO-2016/166735 A1 | 10/2016 |
| WO | WO-2016/172542 A1 | 10/2016 |

OTHER PUBLICATIONS

Japanese Patent Application No. 2019-522300, Notification of Reason for Rejection, dated Nov. 5, 2021.
Atmel Corporation, *Application Note AVR400: Low Cost A/D Converter*, available at http://www.atmel.com/images/doc0942.pfd (last visited Oct. 24, 2013).
Chinese patent application No. 201480034145.1, Notification of First Office Action (with English translation), dated May 4, 2017.
Chinese Patent Application No. 201480034145.1, Notification of the Second Office Action, dated Jan. 19, 2018.
Chinese Patent Application No. 201580028499.X, Office Action and Search Report, dated Aug. 29, 2018.
Decision of Rejection (English translation), Japanese patent application No. 2014-547574, dated Feb. 21, 2017.
European Patent Application No. 15728682.4, Communication Pursuant to Article 94(3) EPC, dated Aug. 13, 2018.
European patent application No. EP 14813210, Supplementary European Search Report, dated Nov. 25, 2016.
International Application No. PCT/US2017/059465, International Preliminary Reporton Patentability, dated Nov. 28, 2018.
International Application No. PCT/US2017/059465, International Search Report and Written Opinion, dated Jan. 18, 2018.
International Application No. PCT/US2017/059466, International Search Report and Written Opinion, dated May 28, 2018.
International Application No. PCT/US2017/059466, Invitation to Pay Additional Fees And, Where Applicable, Protest Fee, dated Mar. 22, 2018.
International Application No. PCT/US2017/059466. Written Opinion of the International Preliminary Examining Authority, dated Nov. 22, 2018.
International Application No. PCT/US2017/059469, International Search Report and Written Opinion, dated Jan. 18, 2018.
International Application No. PCT/US2017/059469, Written Opinion of the International Preliminary Examining Authority, dated Dec. 5, 2018.
International Application No. PCT/US2017/059472, Written Opinion of the International Preliminary Examining Authority, dated Nov. 9, 2018.
International Application No. PCT/US2017/059474, International Search Report and Written Opinion, dated Jan. 19, 2018.
International Application No. PCT/US2017/059474, Written Opinion of the International Preliminary Examining Authority, dated Nov. 23, 2018.
International Preliminary Report on Patentability, International Application No. PCT/US2015/031335, dated Dec. 6, 2016.
International Search Report and Written Opinion for corresponding International Application No. PCT/US2017/059472, dated Jan. 16, 2018.
International Search Report and Written Opinion, International Application No. PCT/US2016/048996, dated Nov. 18, 2016.
International Search Report in corresponding International Application No. PCT/US2014/038586 dated Sep. 1, 2014.
Japanese patent application No. 2016-521535, Notice of Rejection, dated Nov. 15, 2016.
Japanese patent application No. 2017-026242, Notification of Reason for Rejection (English Translation), dated Jan. 9, 2018.
Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).
Notice of Rejection (English translation), Japanese patent application No. 2016-514988, dated Dec. 6, 2016.
Notification of Reason for Rejection (Translation), Japanese patent application No. 2014-547574, dated Feb. 5, 2016.
Notification of Reason for Rejection (Translation), Japanese patent application No. 2014-547574, dated Jul. 31, 2015.
Notification of Reason for Rejection, Japanese patent application No. 2014-547574, dated Oct. 28, 2016.
Notification of the First Office Action (Translation), Chinese patent application No. 201280064609.4, dated Feb. 3, 2016.
Notification of the Second Office Action (with English translation), Chinese Patent Application No. 201280064609.4, dated Oct. 19, 2016.
Notification of the Second Office Action, corresponding Chinese patent application No. 201480029038.X, dated Sep. 26, 2017 (English Translation).
Office Action (with English translation), Chinese Patent Application No. 201380065792.4, dated Aug. 17, 2016.
Office Action for corresponding European Patent Application No. EP 14 733 419.7, dated Dec. 8, 2017 (English Translation).
PCT International Search Report and Written Opinion in corresponding international application PCT/US2015/041878 dated Oct. 2, 2015.
PCT International Search Report in corresponding International Application PCT/US2014/038586 dated Sep. 5, 2014.
PCT International Search Report with Written Opinion in corresponding Int'l appln. PCT/US2013/075912 dated Apr. 17, 2014.
PCT International Search Report with Written Opinion in corresponding International Application PCT/US2014/031858 dated Jul. 2, 2014.
PCT International Search report with Written Opinion in corresponding International application PCT/US2014/042898 dated Nov. 7, 2014.
PCT International Search Report with Written Opinion in corresponding international application PCT/US2015/031335 dated Jul. 30, 2015.
PCT International Search Report with Written Opinion in corresponding International Application PCT/US2015/041874 dated Oct. 15, 2015.
Tethercell Smart Battery Adapter fundraising campaign on Indiegogo website (<https://www.indiegogo.com/projects/tethercell-smart-battery-adapter#/>) (launched Oct. 2013).
Tethercell video uploaded at <https://vimeo.com/53823785> (Oct. 2012).

(56) References Cited

OTHER PUBLICATIONS

U.S. Appl. No. 14/842,266, "Battery Including an On-Cell Indicator", filed Sep. 1, 2015.
U.S. Appl. No. 15/340,731, "Single Sided Reusable Battery Indicator", filed Nov. 1, 2016,.
U.S. Appl. No. 15/340,737, "Positive Battery Terminal Antenna Ground Plane", filed Nov. 1, 2016.
U.S. Appl. No. 15/340,757, "Dual Sided Reusable Battery Indicator", filed Nov. 1, 2016.
U.S. Appl. No. 15/340,773, "Reusable Battery Indicator with Lock and Key Mechanism", filed Nov. 1, 2016.
U.S. Appl. No. 15/340,789, "Reusable Battery Indicator with Electrical Lock and Key", filed Nov. 1, 2016.
U.S. Appl. No. 15/842,245, "Battery Including an On-Cell Indicator", filed Sep. 1, 2015.
Yamashiro, Voltage Detecting Circuit, Japanese Patent No. 52005581, Hitashi Ltd., (Jan. 17, 1977), Translated by the United States Patent and Trademark Office via Phoenix Translations (Elgin, TX) in Feb. 2018.
International Application No. PCT/US2017/059472, International Preliminary Reporton Patentnability, dated Jan. 31, 2019.
International Preliminary Report on Patentability (IPRP) for International Appl. No. PCT/US2017/059474, dated Feb. 18, 2019.
International Preliminary Report on Patentability (IPRP) for International Appl. No. PCT/US2017/059466, dated Feb. 22, 2019.
Chinese Patent Application No. 201710535133.2, Notification of the First Office Action, dated Mar. 4, 2019.
International Preliminary Report on Patentability (IPRP) for International Appl. No. PCT/US2017/059469, dated Feb. 13, 2019.
Japanese Patent Application No. 2017/515681, Decision of Grant, dated Jun. 28, 2019.
Japanese Patent Application No. 2018-243148, Notification of Reason for Rejection, dated Jan. 7, 2020.
European Patent Application No. 14813210.3, Summons to Attend Oral Proceedings Pursuant to Rule 115(1) EPC, dated Feb. 11, 2020.
U.S. Office Action for U.S. Appl. No. 15/340,757, dated Dec. 31, 2018.
U.S. Office Action for U.S. Appl. No. 15/340,757, dated Jul. 3, 2019.
European Patent Application No. 17804720.5, Communication under Rule 71(3) EPC, dated Mar. 20, 2020.
Chinese Patent Application No. 20190306071.7, First Office Action, dated Jun. 18, 2020.
Marrocco, Body-matched RFID antennas for wireless biometry, 2006 First European Conference on Antennas and Propagation, (Nov. 6-10, 2006).
European Patent Application No. 14813210.3, Communication Pursuant to Article 94(3) EPC, dated Sep. 17, 2020.
Japanese Patent Application No. 2019-132998, Notification of Reason for Rejection, dated Sep. 29, 2020.
European Patent Application No. 14733419.7, Communication Pursuant to Article 94(3) EPC, dated Dec. 2, 2020.
U.S. Office Action for U.S. Appl. No. 16/834,827, dated Oct. 14, 2020.
Japanese Patent Application No. 2019-522300, Notification of Reason for Rejection, dated Mar. 15, 2022.

\* cited by examiner

DUAL SIDED REUSABLE BATTERY INDICATOR

RELATED APPLICTIONS

This application is a continuation of U.S. patent application No. 16/834,827, filed Mar. 30, 2020, which is a continuation of U.S. patent application No. 15/340,757, filed Nov. 1, 2016, the entirety of both U.S. patent application Nos. 16/834,827 and 15/340,757 is hereby incorporated by reference herein.

FIELD OF THE INVENTION

The disclosure relates generally to battery indicators and, more specifically, relates to a two sided reusable battery characteristic indicator.

BACKGROUND OF THE INVENTION

Electrochemical cells, or batteries, are commonly used as electrical energy sources. A battery contains a negative electrode, typically called the anode, and a positive electrode, typically called the cathode. The anode contains an electrochemically active anode material that can be oxidized. The cathode contains an electrochemically active cathode material that can be reduced. The electrochemically active anode material is capable of reducing the electrochemically active cathode material. A separator is disposed between the anode and the cathode. The battery components are disposed in a can, or housing, that is typically made from metal.

When a battery is used as an electrical energy source in an electronic device, electrical contact is made to the anode and the cathode, thereby completing a circuit that allows electrons to flow through the device, and which results in respective oxidation and reduction reactions that produce electrical power to the electronic device. An electrolyte is in contact with the anode, the cathode, and the separator. The electrolyte contains ions that flow through the separator between the anode and cathode to maintain charge balance throughout the battery during discharge.

There is a growing need for portable power for electronic devices such as toys; remote controls; audio devices; flashlights; digital cameras and peripheral photography equipment; electronic games; toothbrushes; radios; clocks, and other portable electronic devices. Consumers need to have power readily available for these electronic devices. Because batteries necessarily become depleted of power over time as they are used, consumers need to have access to spare batteries (and/or access to fully recharged rechargeable batteries). It is helpful for a consumer to know the power state of a battery currently in use so that the consumer can have quick access to the needed number of replacement batteries. Batteries come in common sizes, such as the AA, AAA, AAAA, C, and D battery sizes, that have fixed external dimensions and constrained internal volumes per ANSI standard.

Currently, some batteries include on-cell battery charge indicators to help a consumer determine when a battery is nearly depleted and in need of replacement. However, these current on-cell battery charge indicators are single use (i.e., attached to a single battery cell) and cumbersome (because typically two contact buttons must be simultaneously depressed to activate the indicator). Additionally, these on-cell battery indicators require removal of the battery from an electronic device (or package) in order to use the indicator.

SUMMARY OF THE INVENTION

According to some aspects, a reusable battery indicator comprises a voltage sensor configured to convert sensed analog characteristics of a battery to digital information; a communication circuit communicatively connected to the voltage sensor; an antenna operatively coupled to the communication circuit; and a connection mechanism having at least a first connector and a second connector that are electrically connected to the voltage sensor. The first connector and the second connector are adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal.

According to another aspect, a remote battery indication system comprises a battery; and a reusable battery indicator, the battery indicator including a voltage sensor, a communication circuit communicatively connected to the voltage sensor, an antenna operatively coupled to the communication circuit, and a connection mechanism having at least a first connector and a second connector that are electrically connected to the voltage sensor. The first connector and the second connector are adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal. The first connector and the second connector are electrically attached to a first battery terminal and a second battery terminal, respectively, so that the voltage sensor senses an electrical characteristic of the battery.

In accordance with the teachings of the disclosure, any one or more of the foregoing aspects of a reusable battery indicator or a remote battery indication system may further include any one or more of the following optional forms.

In some optional forms a voltage booster may be electrically connected to or incorporated in the voltage sensor.

In other preferred forms, at least one of the first connector and the second connector comprises at least one of a magnet, a cup, a sleeve, a tab, a socket, a pin, a washer, a spring connector, or any combination thereof.

In yet other preferred forms, at least one of the first connector and the second connector comprises at least one metal and at least one insulator.

In yet other preferred forms, at least one of the first connector and the second connector comprises at least one of a metal, a metal alloy, cold-rolled steel, carbon, or any combination thereof.

In yet other preferred forms, the communication circuit may comprise at least one of radio-frequency identification circuitry, Bluetooth® circuitry, Bluetooth® low energy circuitry, Wi-Fi circuitry, Zigbee® circuitry, LORA circuitry, and Z-wave circuitry.

In yet other preferred forms, the voltage sensor is capable of reading an open circuit voltage of less than 1.8 Volts.

In yet other preferred forms, the voltage sensor, and the communication circuit are formed on a printed circuit board that is adapted to be inserted between the first connector and the second connector.

In yet other preferred forms, the first connector and the second connector may comprise flexible wires with conductive magnets.

In yet other preferred forms, the voltage sensor, and the communication circuit are mounted within a housing, and the housing is sized and shaped to fit between two cylindrical batteries that are arranged longitudinally side-by-side.

In yet other preferred forms, the housing has a cross-section that is in the shape of a triangular prism.

In yet other preferred forms, the housing has one side that is concave or two sides that are concave.

In yet other preferred forms, the voltage sensor is disc-shaped and the voltage sensor is arranged to fit one end of a cylindrical battery cell.

In yet other preferred forms, the voltage sensor is one of a thin disc BLE, UHF, or RF module.

In yet other preferred forms, a housing of the reusable battery indicator is mounted within a battery receptacle of an electronic device.

In yet other preferred forms, a computing device is communicatively connected to the communication circuit, and the computing device receives information from the communication circuit through the antenna.

In yet other preferred forms, the computing device includes a processor and a memory, the memory storing a software routine that causes the processor to detect a wireless communication signal from the reusable battery indicator, to remotely control battery circuitry through the reusable battery indicator to determine battery characteristic data; and to send the battery characteristic data to a user interface.

In yet other preferred forms, the battery characteristic data comprises at least one of an electrical capacity, a voltage, an impedance, a temperature, a current, an age, a charge/discharge cycle count, and a coulomb count.

In yet other preferred forms, the software routine, when executed by the processor, causes the processor to determine at least one of a battery type, a physical location of the battery, and an electrical device that the battery is powering.

BRIEF DESCRIPTION OF THE DRAWINGS

While the specification concludes with claims particularly pointing out and distinctly claiming the subject matter, which is regarded as forming the present invention, the invention will be better understood from the following description taken in conjunction with the accompanying drawings.

DETAILED DESCRIPTION OF THE INVENTION

Electrochemical cells, or batteries, may be primary or secondary. Primary batteries are meant to be discharged, e.g., to exhaustion, only once and then discarded. Primary batteries (or disposable batteries) are described, for example, in David Linden, *Handbook of Batteries* ($4^{th}$ ed. 2011). Secondary batteries (or rechargeable batteries) are intended to be recharged and used over and over again. Secondary batteries may be discharged and recharged many times, e.g., more than fifty times, a hundred times, or more. Secondary batteries are described, for example, in David Linden, *Handbook of Batteries* ($4^{th}$ ed. 2011). Accordingly, batteries may include various electrochemical couples and electrolyte combinations. Although the description and examples provided herein are generally directed towards primary alkaline electrochemical cells, or batteries, it should be appreciated that the invention applies to both primary and secondary batteries of aqueous, nonaqueous, ionic liquid, and solid state systems. Primary and secondary batteries of the aforementioned systems are thus within the scope of this application and the invention is not limited to any particular embodiment.

Figure 1:
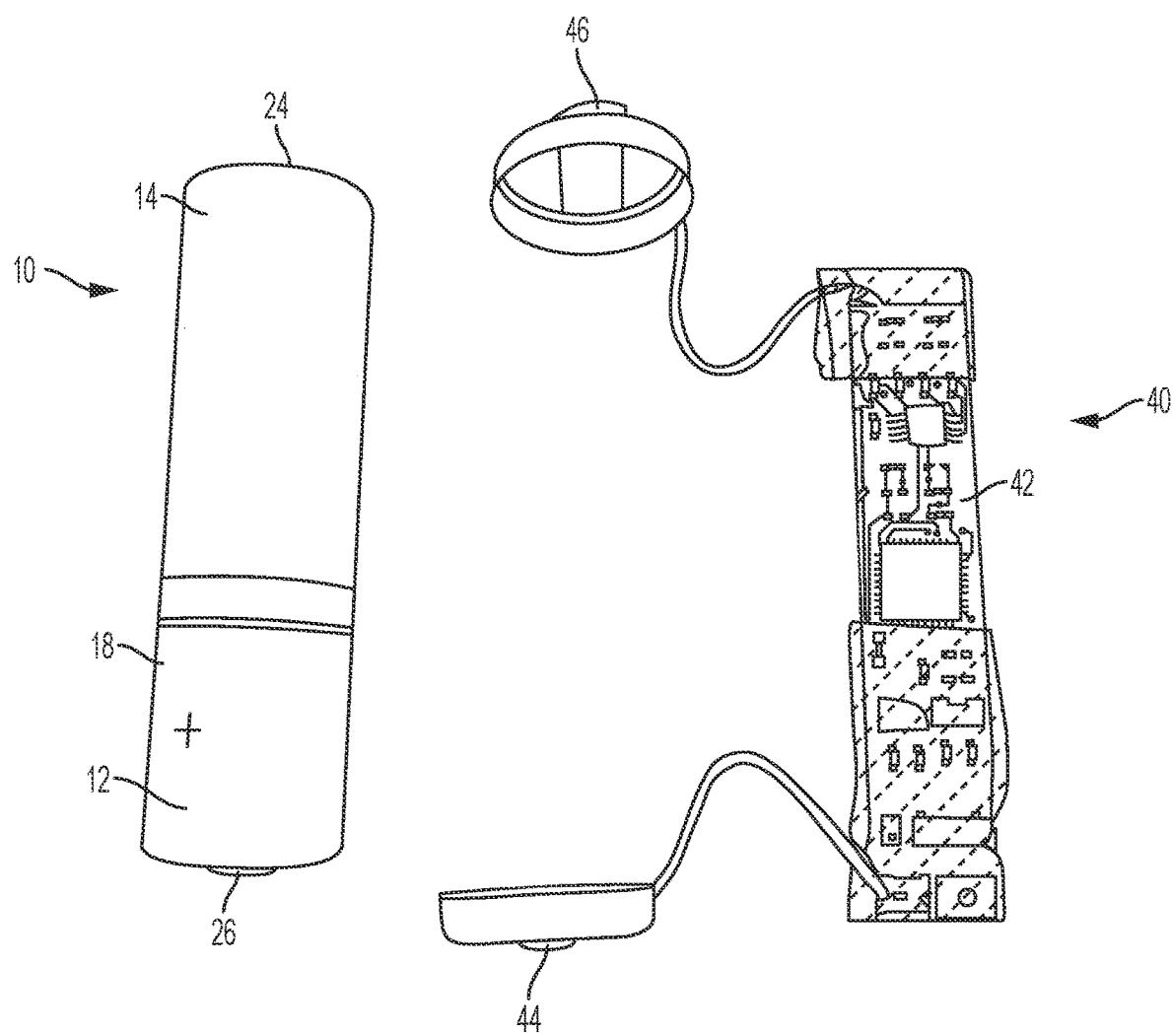
FIG. 1 is a top plan view of a battery cell and a reusable battery indicator constructed in accordance with the teachings of the disclosure, the battery cell and the reusable battery indicator being separated from one another.
Figure 2:
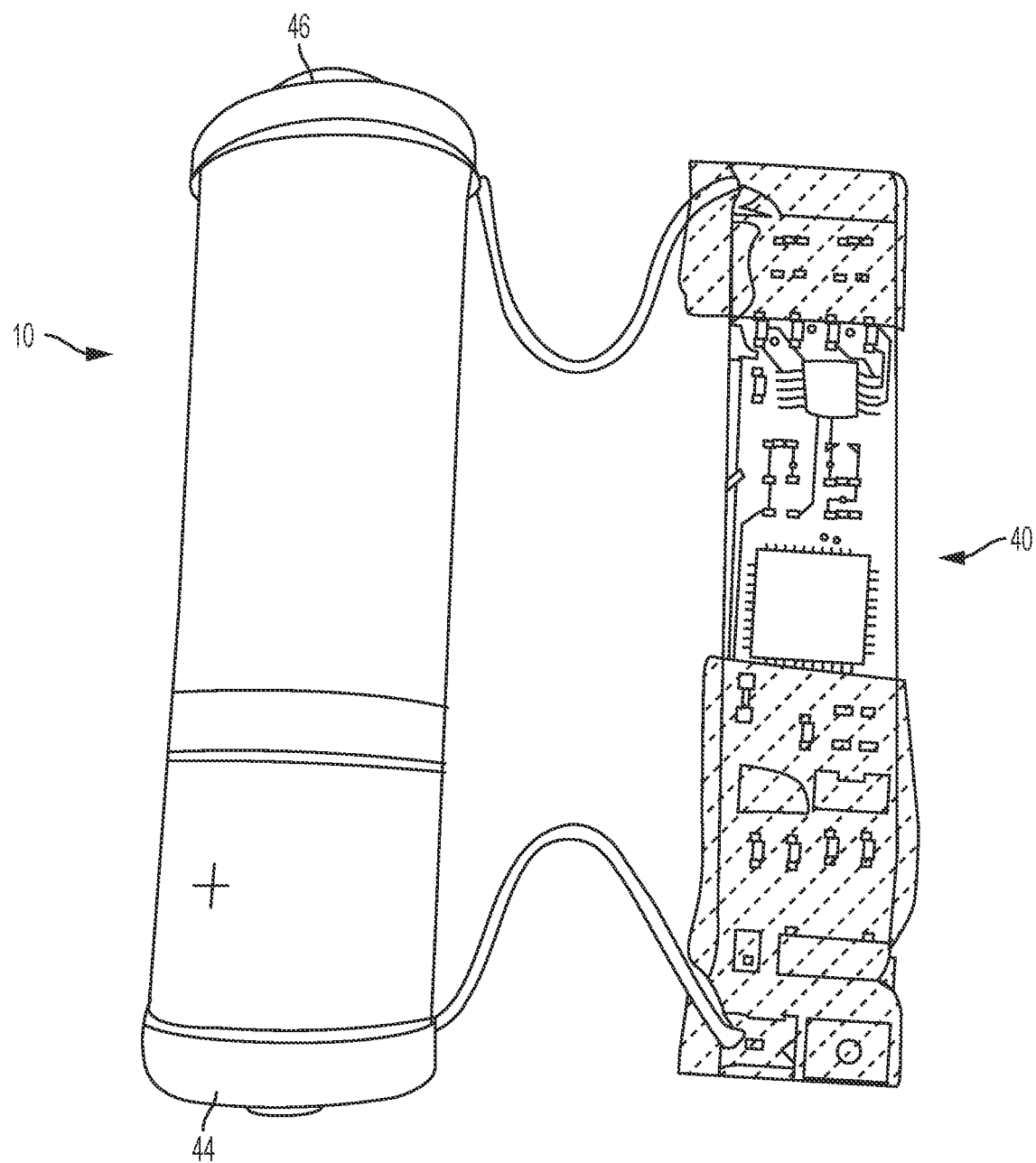
FIG. 2 is a top plan view of the reusable battery indicator of FIG. 1 connected to the battery cell.

Referring to FIGS. 1 and 2, a primary alkaline electrochemical cell, or battery cell 10, is illustrated that includes a cathode 12, an anode 14, and a housing 18. The battery cell 10 also includes an end cap 24. The end cap 24 serves as a negative terminal of the battery cell 10. A positive pip 26 is located at the opposite end of the battery cell 10 from the end cap 24. The positive pip 26 serves as a positive terminal of the battery cell 10. An electrolytic solution is dispersed throughout the battery cell 10. The battery cell 10 can be, for example, a AA, AAA, AAAA, C, or D alkaline battery. Additionally, in other embodiments, the battery cell 10 can be a 9V battery, a camera battery, a watch battery, or any other type of primary or secondary battery.

The housing 18 can be made of any suitable type of housing base material, for example cold-rolled steel or nickel-plated cold-rolled steel. In the embodiment illustrated in FIG. 1, the housing 18 may have a cylindrical shape. In other embodiments, the housing 18 may have any other suitable, non-cylindrical shape. The housing 18, for example, may have a shape comprising at least two parallel plates, such as a rectangular, square, or prismatic shape. The housing 18 may be, for example, deep-drawn from a sheet of the base material, such as cold-rolled steel or nickel-plated steel. The housing 18 may be, for example, drawn into a cylindrical shape. The housing 18 may have a sidewall. The interior surface of the sidewall of the housing 18 may be treated with a material that provides a low electrical-contact resistance between the interior surface of the sidewall of the housing 18 and an electrode, such as the cathode 12. The interior surface of the sidewall of the housing 18 may be plated, e.g., with nickel, cobalt, and/or painted with a carbon-loaded paint to decrease contact resistance between, for example, the internal surface of the sidewall of the housing 18 and the cathode 12.

Next to the battery cell 10 is one embodiment of a communication mechanism, such as a reusable battery indicator 40. The reusable battery indicator 40 includes an integrated circuit, which may be incorporated into a printed circuit board (PCB) 42, a first connector 44 that is electrically connected to the PCB 42, and a second connector 46 that is electrically connected to the PCB 42. The first connector 44 may be removably and electrically connected to the positive pip 26 to form a positive electrical connection and the second connector 46 may be removably and electrically connected to the end cap 24 to form a negative electrical connection, as illustrated in FIG. 2. The first connector 44 and the second connector 46 may take virtually any physical form that allows the first connector 44 and the second connector 46 to form electrical connections with the battery cell 10 and the PCB 42. In some embodiments, the first connector 44 and the second connector 46 may take any one or more of the following forms, a magnet, a cup, a sleeve, a tab, a socket, a pin, a washer, a spring connector, a wire loop, or any combination thereof. Moreover, the first connector 44 and the second connector 46 may be formed from virtually any material that transmits analog information, such as electrical information, from the battery cell to the PCB 42. For example, in some embodiments, the first connector 44 and the second connector 46 may be formed from one or more of the following materials, a metal, a metal alloy, cold-rolled steel, hard drawn ferrous and non-ferrous alloys, high and low carbon steel alloys, post or pre-plated ferrous and non-ferrous alloys, or any combination thereof. In some embodiments, at least one of the first connector 44 and the second connector 46 may comprise a metal and an insulator. More specifically, an inner surface of the first and second connectors 44, 46 may include a non-conductive coating (such as a polymer layer, epoxy, or passivate) or an additional insulator ring (e.g., paper, phenolic, or polymer) in areas other than contact areas for the terminals to guard against shorting to the battery housing or crimp.

Generally, the integrated circuit receives electrical information, such as amperes or volts from the first connector 44 and from the second connector 46, and the electrical information is used by the integrated circuit to calculate battery characteristic information, such as power or charge level, and the integrated circuit then transmits the battery characteristic information to a receiver, such as a computer, a smart phone, or a personal digital assistant, for use by the consumer. In this way, the reusable battery indicator 40 allows a consumer to acquire the battery characteristic information without removing the battery cell from an electronic device (or from a package). The first connector 44 and the second connector 46 deliver the electrical information to the integrated circuit without interfering with electrical contacts between the battery cell and the electronic device. Furthermore, the reusable battery indicator 40 is movable from one battery cell to another battery cell so as to be reused over and over again, thereby reducing the overall cost to a consumer.

Figure 3:
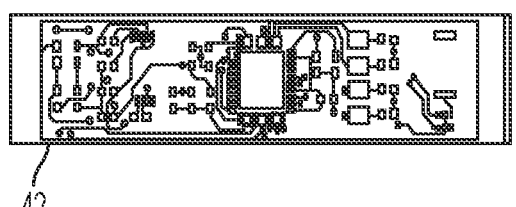
FIG. 3 is a close-up plan view of a printed circuit board of the reusable battery indicator of FIG. 1.
Figure 4:
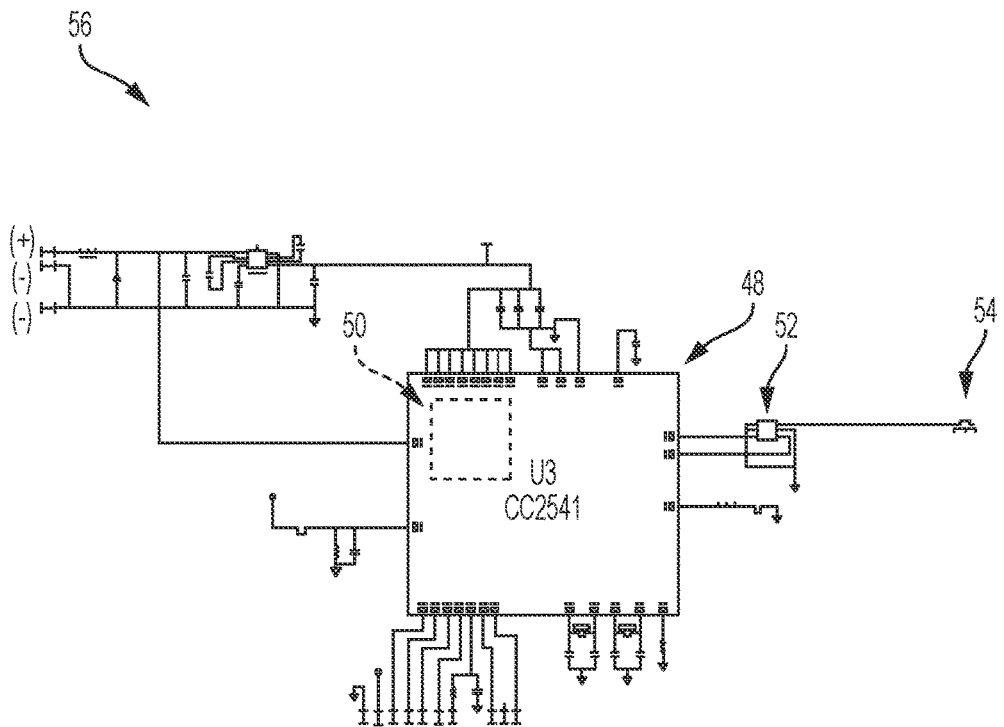
FIG. 4 is an electronic circuit schematic diagram of the reusable battery indicator of FIG. 1.

Turning now to FIGS. 3 and 4, formed on the PCB 42 is an integrated circuit 48, that includes an embedded voltage sensor 50 within the integrated circuit 48 that is communicatively connected to the first connector 44 and to the second connector 46. The embedded voltage sensor 50 senses analog characteristics of the battery cell, such as amperes and voltage and converts the sensed analog characteristics to digital information. The PCB 42 also includes a communication circuit 52. An antenna 54 is operatively coupled to the communication circuit 52. The communication circuit 52 may comprise one or more of a radio-frequency identification circuit, a Bluetooth® circuit, a Bluetooth® low energy circuit, a Wi-Fi circuit, a Zigbee® circuit, a LORA circuit, and a Z-wave circuit. In one embodiment, an integrated circuit, such as a wireless Bluetooth Low-Energy voltage sensor, may incorporate the analog to digital converter, a microcontroller, a Bluetooth radio, a memory device, and a DC/DC voltage converter.

A voltage booster 56 is electrically connected to the integrated circuit 48 and the embedded voltage sensor 50. The embedded voltage sensor 50 and the voltage booster 56 are capable of reading the open circuit voltage of the battery that may be, for example, less than 1.8 volts. In some embodiments, the communication circuit 52 may comprise one or more of a thin disc BLE module, a UHF module, or a RF module.

In the embodiment illustrated in FIGS. 3 and 4, the integrated circuit 48, the voltage sensor 50, and the communication circuit 52 are all formed on the PCB 42, which is connected to the first connector 44 and the second connector 46. However, in other embodiments, the integrated circuit 48, the voltage sensor 50, and the communication circuit 52 may be formed as separate components that are communicatively and operatively connected to one another.

Figures 5A, 5B:
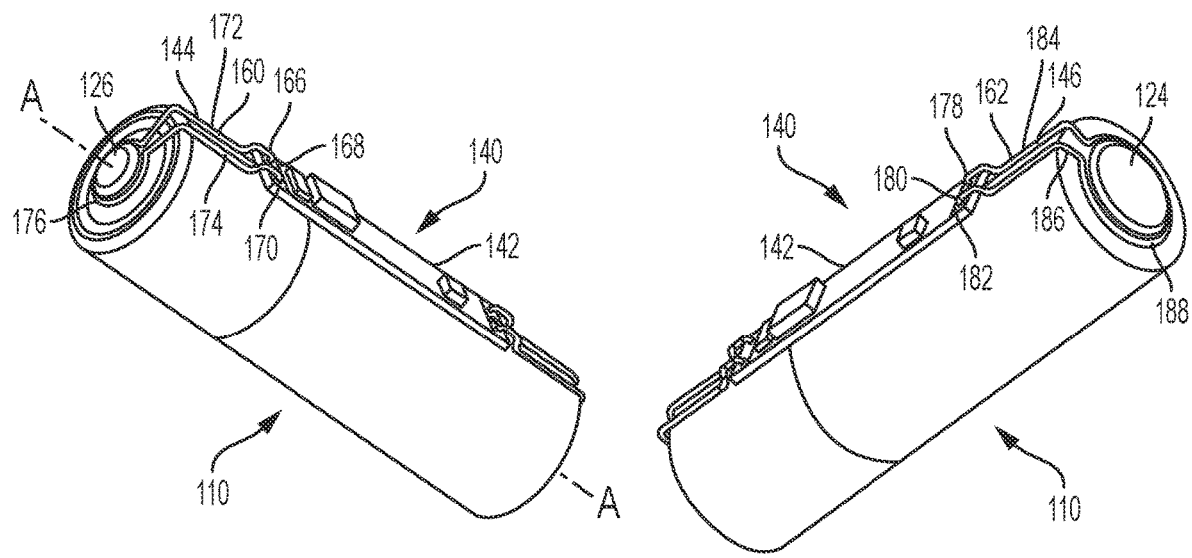
FIGS. 5A and 5B are top and bottom perspective views, respectively, of a second embodiment of a reusable battery indicator that is connected to a battery cell.

In the embodiment illustrated in FIGS. 5A and 5B, similar elements are numbered exactly 100 greater than elements numbered in FIGS. 1-4. For example, the battery cell is numbered 10 in FIGS. 1-4 and the battery cell is numbered 110 in FIGS. 5A and 5B. Unless stated otherwise, any element from any illustrated embodiment may be incorporated into any other illustrated embodiment.

Turning now to FIGS. 5A and 5B, a second embodiment of the reusable battery indicator 140 is attached to a battery cell 110. The reusable battery indicator 140 includes a PCB 142, a first connector 144, and a second connector 146. While the battery cell 110 in FIGS. 5A and 5B is illustrated as a AA size battery, the illustration is not intended to limit the reusable battery indicator 140 to the illustrated battery cell 110. Rather, the reusable battery indicator 140 may be sized and shaped to fit virtually any battery cell, especially those battery cell sizes listed elsewhere in the specification.

In the embodiment illustrated in FIGS. 5A and 5B, the first connector 144 and the second connector 146 comprise flexible wires 160, 162, respectively. The flexible wires 160, 162 may be formed as spring wires (from hard drawn ferrous and non-ferrous spring alloys) that capture the positive battery terminal 126 and the negative battery terminal 124, respectively, to transmit electrical characteristics, such as voltage and amperes, to the integrated circuit formed on the PCB 142. In the illustrated embodiment, the flexible wires 160, 162 are formed of ASTM A228 music wire with pre or post nickel plating to enhance conductivity, to reduce contact resistance, and to provide corrosion resistance.

In the embodiment illustrated in FIGS. 5A and 5B, the flexible wire 160 includes a first end 166, which is connected to a positive terminal 168 on the PCB 142 and a second end 170, which is also connected to the positive terminal 168 on the PCB 142. The flexible wire 160 includes a first leg 172, extending from the first end 166 and a second leg 174 extending from the second end 170. The first leg 172 and the second leg 174 are oriented substantially parallel to a longitudinal axis A of the battery cell 110. The first leg 172 and the second leg 174 are connected to one another at an end loop 176. The end loop 176 lies in a plane that is substantially perpendicular to the longitudinal axis of the battery cell 110. The end loop 176 is sized and shaped to fit around the positive terminal 126 of the battery cell 110. As a result, the flexible wire 160 forms a positive electrical pathway from the positive battery terminal 126 to the positive terminal 168 on the PCB 142. Moreover, the flexible wire 160 may be formed to produce a spring force that biases the flexible wire 160 into the attached position illustrated in FIGS. 5A and 5B, while allowing the flexible wire 160 to be temporarily deformed by a user to remove the reusable battery indicator 140 from the battery cell 110 when desired.

Similar to the flexible wire 160, the flexible wire 162 includes a first end 178, which is connected to a negative terminal 180 on the PCB 142 and a second end 182, which is also connected to the negative terminal 180 on the PCB 142. The flexible wire 162 includes a first leg 184, extending from the first end 178 and a second leg 186 extending from the second end 182. The first leg 184 and the second leg 186 are oriented substantially parallel to the longitudinal axis A of the battery cell 110. The first leg 184 and the second leg 186 are connected to one another at an end loop 188. The end loop 188 lies in a plane that is substantially perpendicular to the longitudinal axis of the battery cell 110. The end loop 186 is sized and shaped to fit around the negative terminal 124 of the battery cell 110. As a result, the flexible wire 162 forms a negative electrical pathway from the negative battery terminal 124 to the negative terminal 180 on the PCB 142. Moreover, the flexible wire 162 may be formed to produce a spring force that biases the flexible wire 162 into the attached position illustrated in FIGS. 5A and 5B, while allowing the flexible wire 162 to be temporarily deformed by a user to remove the reusable battery indicator 140 from the battery cell 110 when desired.

The approximately 90° bends between the first and second legs 172, 174 of the first flexible wire 160 and the end loop 176 and between the first and second legs 184, 186 of the second flexible wire 162 and the end loop 188, create an axial force, which maintains the reusable battery indicator 140 in electrical connection with the battery cell 110. In other embodiments, the bends may be more than 90° to mate to a tapered positive terminal.

In some embodiments, one or more of the first flexible wire 160 and the second flexible wire 162 may include a conductive magnet, or the one or more of the first flexible wire 160 and the second flexible wire 162 may be formed from conductive magnetic material, to provide additional retention force between the first flexible wire 160 and the positive terminal 126 and between the second flexible wire 162 and the negative terminal 124.

In other embodiments, one or more of the first flexible wire 160 and the second flexible wire 162 may be formed as a Kelvin connection, including separate power and sensing terminals, to measure impedance. Additionally, in alternate embodiments, the first flexible wire 160 and the second flexible wire 162 need not be formed as a single continuous wire, but may be formed as multiple wire pieces, for example, two wire pieces that are separated by a small distance in the end loop.

Figure 6:
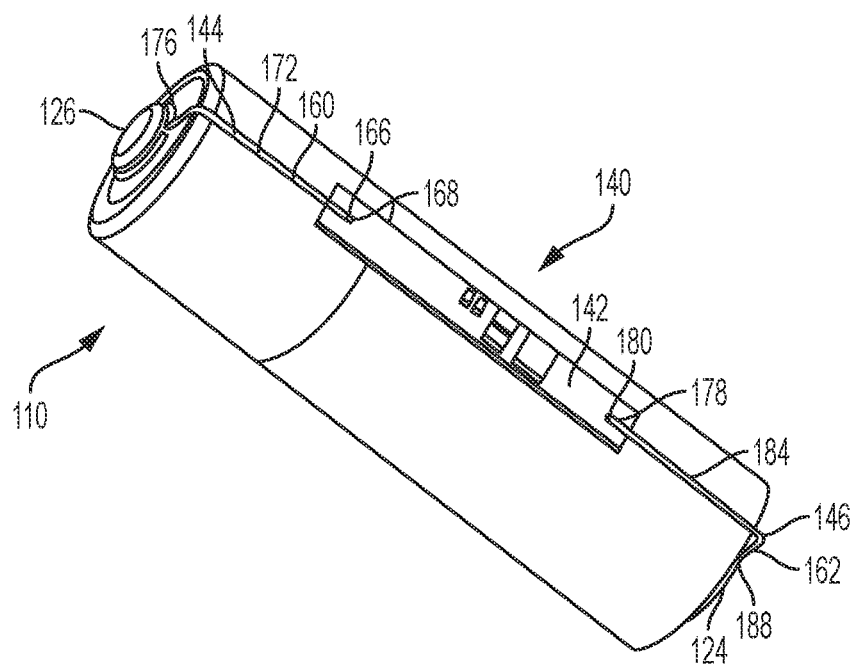
FIG. 6 is a top perspective view of a third embodiment of a reusable battery indicator that is connected to a battery cell.

As in FIGS. 5A and 5B, in the embodiment of FIG. 6, similar elements are numbered exactly 100 greater than elements numbered in FIGS. 1-4. For example, the battery cell is numbered 10 in FIGS. 1-4 and the battery cell is numbered 110 in FIG. 6. Unless stated otherwise, any element from any illustrated embodiment may be incorporated into any other illustrated embodiment.

Turning now to FIG. 6, a third embodiment of the reusable battery indicator 140 is attached to a battery cell 110. The reusable battery indicator 140 includes a PCB 142, a first connector 144, and a second connector 146. While the battery cell 110 in FIG. 6 is illustrated as a AA size battery, the illustration is not intended to limit the reusable battery indicator 140 to the illustrated battery cell 110. Rather, the reusable battery indicator 140 may be sized and shaped to fit virtually any battery cell, especially those battery cell sizes listed elsewhere in the specification.

In the embodiment illustrated in FIG. 6, the first connector 144 and the second connector 146 comprise flexible wires 160, 162, respectively. The flexible wires 160, 162 may be formed as spring wires that capture the positive battery terminal 126 and the negative battery terminal 124, respectively, to transmit electrical characteristics, such as voltage and amperes, to the integrated circuit formed on the PCB 142.

The flexible wires 160, 162 in FIG. 6 are similar to the flexible wires of FIGS. 5A and 5B, except that the flexible wires 160, 162 in FIG. 6 have only a single leg. More specifically, the flexible wire 160 includes a first end 166, which is connected to a positive terminal 168 on the PCB 142. The flexible wire 160 includes a single leg 172, extending from the first end 166. The single leg 172 is oriented substantially parallel to a longitudinal axis A of the battery cell 110. The single leg 172 forms an end loop 176 at a second end. The end loop 176 lies in a plane that is substantially perpendicular to the longitudinal axis of the battery cell 110. The end loop also lies below the plane of the contact surface of the positive terminal 126. In this manner, the end loop 176 does not interfere with an electronic device making contact with the positive terminal 126. The end loop 176 is sized and shaped to fit around the positive terminal 126 of the battery cell 110. As a result, the flexible wire 160 forms a positive electrical pathway from the positive battery terminal 126 to the positive terminal 168 on the PCB 142. Moreover, the flexible wire 160 may be formed to produce a spring force that biases the flexible wire 160 into the attached position illustrated in FIG. 6, while allowing the flexible wire 160 to be temporarily deformed by a user to remove the reusable battery indicator 140 from the battery cell 110 when desired.

Similar to the flexible wire 160, the flexible wire 162 includes a first end 178, which is connected to a negative terminal 180 on the PCB 142. The flexible wire 162 includes a single leg 184, extending from the first end 178. The single leg 184 is oriented substantially parallel to the longitudinal axis A of the battery cell 110. The single leg 184 forms an end loop 188 at a second end. The end loop 188 lies in a plane that is substantially perpendicular to the longitudinal axis of the battery cell 110. The end loop 188 also lies below the plane of the contact surface of the negative terminal 124. In this manner, the end loop 188 does not interfere with an electronic device making contact with the negative terminal 124. The end loop 188 is sized and shaped to fit around the negative terminal 124 of the battery cell 110. As a result, the flexible wire 162 forms a negative electrical pathway from the negative battery terminal 124 to the negative terminal 180 on the PCB 142. Moreover, the flexible wire 162 may be formed to produce a spring force that biases the flexible wire 162 into the attached position illustrated in FIG. 6, while allowing the flexible wire 162 to be temporarily deformed by a user to remove the reusable battery indicator 140 from the battery cell 110 when desired.

In some embodiments, one or more of the first flexible wire 160 and the second flexible wire 162 may include a conductive magnet, or the one or more of the first flexible wire 160 and the second flexible wire 162 may be formed from conductive magnetic material, to provide additional retention force between the first flexible wire 160 and the positive terminal 126 and between the second flexible wire 162 and the negative terminal 124.

In other embodiments, one or more of the first flexible wire 160 and the second flexible wire 162 may be formed as a Kelvin connection, including separate power and sensing terminals, to measure impedance.

Figures 7A, 7B:
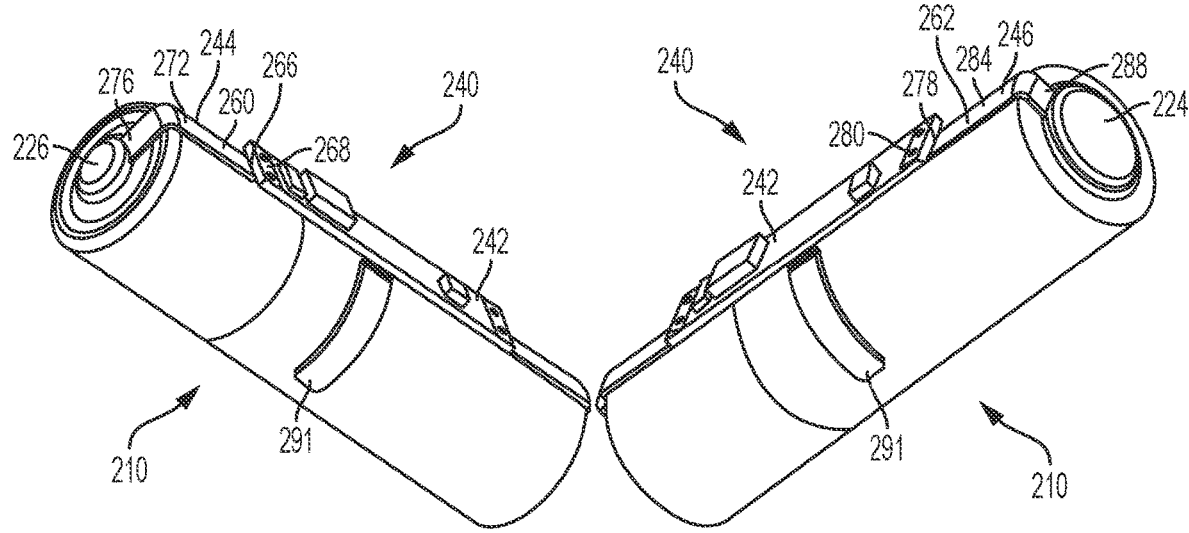
FIGS. 7A and 7B are top and bottom perspective views, respectively, of a fourth embodiment of a reusable battery indicator that is connected to a battery cell.

In the embodiment illustrated in FIGS. 7A and 7B, similar elements are numbered exactly 200 greater than elements numbered in FIGS. 1-4. For example, the battery cell is numbered 10 in FIGS. 1-4 and the battery cell is numbered 210 in FIGS. 7A and 7B. Unless stated otherwise, any element from any illustrated embodiment may be incorporated into any other illustrated embodiment.

Turning now to FIGS. 7A and 7B, a fourth embodiment of the reusable battery indicator 240 is attached to a battery cell 210. The reusable battery indicator 240 includes a PCB 242, a first connector 244, and a second connector 246. While the battery cell 210 in FIGS. 6A and 6B is illustrated as a AA size battery, the illustration is not intended to limit the reusable battery indicator 240 to the illustrated battery cell 210. Rather, the reusable battery indicator 240 may be sized and shaped to fit virtually any battery cell, especially those battery cell sizes listed elsewhere in the specification.

In the embodiment illustrated in FIGS. 7A and 7B, the first connector 244 and the second connector 246 comprise leaf springs 260, 262, respectively. The leaf springs 260, 262 may be formed as planar legs that capture the positive battery terminal 226 and the negative battery terminal 224, respectively, to transmit electrical characteristics, such as voltage and amperes, to the integrated circuit formed on the PCB 142.

In the embodiment illustrated in FIGS. 7A and 7B, the leaf spring 260 includes a first end 266, which is connected to a positive terminal 268 on the PCB 242. The leaf spring 260 includes a first leg 272, extending from the first end 266. The first leg 272 is substantially planar (or very slightly curved to mirror the curvature of the outer surface of the battery cell 210) and is oriented substantially parallel to the longitudinal axis of the battery cell 210. The first leg 272 turns approximately 90° near a second end 273, forming an end clip 276. The end clip 276 lies in a plane that is substantially perpendicular to the longitudinal axis of the battery cell 210. The end clip 276 includes a concave end that is curved to mirror an outer cylindrical surface of the positive terminal 226 of the battery cell 210. As a result, the leaf spring 260 forms a positive electrical pathway from the positive battery terminal 226 to the positive terminal 268 on the PCB 242. Moreover, the leaf spring 260 may be formed to produce a spring force that biases the leaf spring 260 into the attached position illustrated in FIGS. 7A and 7B, while allowing the leaf spring 260 to be temporarily deformed by a user to remove the reusable battery indicator 240 from the battery cell 210 when desired.

Similar to the leaf spring 260, the leaf spring 262 includes a first end 278, which is connected to a negative terminal 280 on the PCB 242. The leaf spring 262 includes a first leg 284, extending from the first end 278. The first leg 284 is substantially planar (or very slightly curved to mirror the curvature of the outer surface of the battery cell 210) and is oriented substantially parallel to a longitudinal axis of the battery cell 210. The first leg 284 turns approximately 90° near a second end 285, forming an end clip 288. The end clip 288 lies in a plane that is substantially perpendicular to the longitudinal axis of the battery cell 210. The end clip 288 includes a concave end that is curved to mirror an outer cylindrical surface of the negative terminal 224 of the battery cell 210. As a result, the leaf spring 262 forms a negative electrical pathway from the negative battery terminal 224 to the negative terminal 280 on the PCB 242. Moreover, the leaf spring 262 may be formed to produce a spring force that biases the leaf spring 262 into the attached position illustrated in FIGS. 7A and 7B, while allowing the leaf spring 262 to be temporarily deformed by a user to remove the reusable battery indicator 240 from the battery cell 210 when desired.

The approximately 90° bends between the first leg 272 of the first leaf spring 260 and the end loop 276 and between the first leg 184 of the second leaf spring 262 and the end loop 288, create an axial force, which maintains the reusable battery indicator 240 in electrical connection with the battery cell 210.

In some embodiments, one or more of the first leaf spring 260 and the second leaf spring 262 may be integrated into the positive terminal 268 and the negative terminal 280, respectively, of the PCB 242 as one layer of a multi-layered PCB 242.

In some embodiments, the reusable battery indicator 240 may also include a retention clip 291 that extends from the reusable battery indicator 240 in a plane substantially perpendicular to the longitudinal axis of the battery cell 210. The retention clip 291 may include two opposing legs that are curved to mirror the curvature of the outer surface of the battery cell 210. The retention clip 291 provides additional retention force to retain the reusable battery indicator 240 on the battery cell 210.

Figures 8A, 8B:
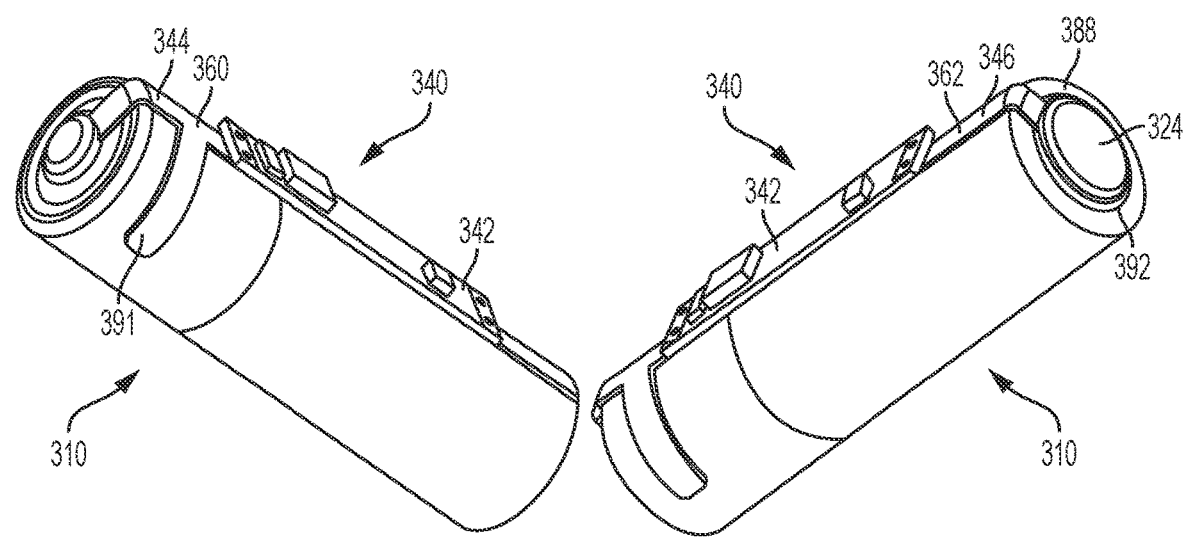
FIGS. 8A and 8B are top and bottom perspective views, respectively, of a fifth embodiment of a reusable battery indicator that is connected to a battery cell.
Figure 9:
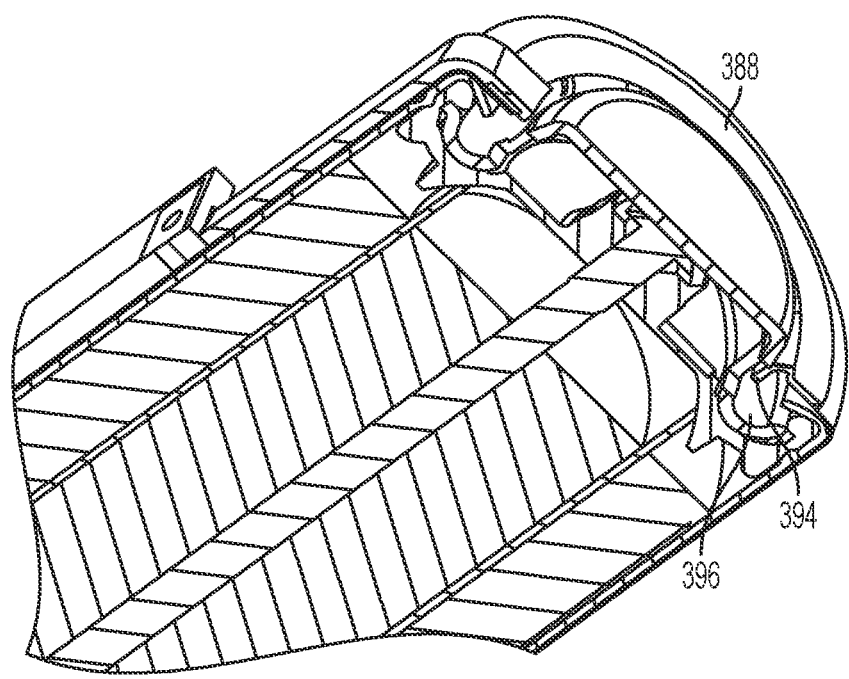
FIG. 9 is a close-up cross-sectional view of a negative radial leaf at one end of the reusable battery indicator of FIGS. 8A and 8B.

In the embodiment illustrated in FIGS. 8A, 8B, and 9, similar elements are numbered exactly 300 greater than elements numbered in FIGS. 1-4. For example, the battery cell is numbered 10 in FIGS. 1-4 and the battery cell is numbered 310 in FIGS. 8A, 8B, and 9. Unless stated otherwise, any element from any illustrated embodiment may be incorporated into any other illustrated embodiment.

Turning now to FIGS. 8A, 8B, and 9, a fifth embodiment of the reusable battery indicator 340 is attached to a battery cell 310. The reusable battery indicator 340 includes a PCB 342, a first connector 344, and a second connector 346. While the battery cell 210 in FIGS. 8A and 8B is illustrated as a AA size battery, the illustration is not intended to limit the reusable battery indicator 340 to the illustrated battery cell 310. Rather, the reusable battery indicator 340 may be sized and shaped to fit virtually any battery cell, especially those battery cell sizes listed elsewhere in the specification.

Similar to the previous embodiment, in the embodiment illustrated in FIGS. 8A, 8B, and 9, the first connector 344 and the second connector 346 comprise first and second leaf springs 360, 362, respectively. The first and second leaf springs 360, 362 are similar to the first and second leaf springs 260, 262 of FIGS. 7A and 7B, with the following exceptions.

In the embodiment illustrated in FIGS. 8A, 8B, and 9, the first leaf spring 360 includes a retention clip 391 that extends in a plane that is substantially perpendicular to the longitudinal axis of the battery cell 310. In other embodiments, the second leaf spring 362 may include a similar retention clip. The retention clip 391 may include two opposing legs that are curved to mirror the curvature of the outer surface of the battery cell 310. The retention clip 391 provides additional retention force to retain the reusable battery indicator 340 on the battery cell 310.

Instead of including an end clip, the second leaf spring 346 includes an end loop 388. The end loop 388 lies in a plane that is substantially perpendicular to the longitudinal axis of the battery cell 310. The end loop 388 includes an inner opening 392 that is sized and shaped to mirror an outer cylindrical surface of the negative battery terminal 324. As a result, the second leaf spring 362 forms a negative electrical pathway from the negative battery terminal 324 to the negative terminal on the PCB 342.

In some embodiments, the end loop 388 may include a disc-shaped voltage sensor that is arranged to fit one end of the cylindrical battery cell 310.

Turning specifically now to FIG. 9, the end loop 388 may include a radial collar 394 that extends away from the end loop 388, towards the PCB 342. The radial collar 394 is sized and shaped to fit within a negative cap recess 396. The radial collar 394 provides negative terminal location and contact force, in addition to the end loop 388.

In other embodiments, a similar end loop with a radial collar may be formed in the first leaf spring for contact at the positive battery terminal. In such embodiments, the radial collar may provide additional clearance at the positive battery terminal where a reverse polarity insertion guard exists.

The end loop 388 and radial collar 394 cooperate with battery cells having a negative cap/positive crimp groove.

Figure 10:
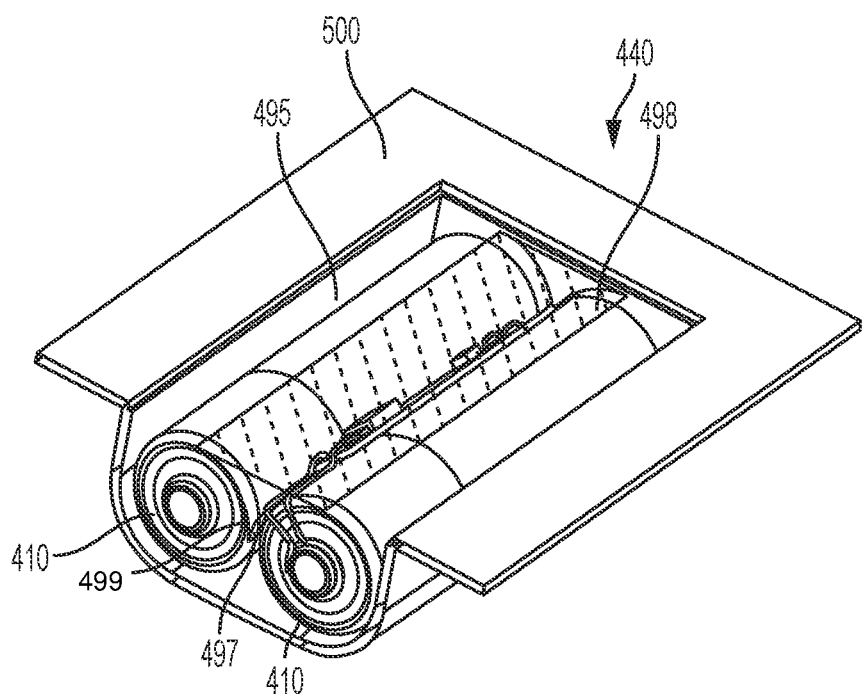
FIG. 10 is a bottom perspective view of a battery compartment of an electronic device including two battery cells and a sixth embodiment of a reusable battery indicator that is connected to one of the battery cells.

Turning now to FIG. 10, a sixth embodiment of a reusable battery indicator 440 is illustrated. In the embodiment of FIG. 10, the reusable battery indicator includes a housing 498, the integrated circuit, the voltage sensor, and the communication circuit being mounted within the housing 498. In the embodiment of FIG. 10, the housing 498 is sized and shaped to fit between two cylindrical battery cells 410 that are arranged longitudinally side-by-side. In the embodiment illustrated in FIG. 10, the housing 498 has a cross-section that is in the shape of a triangular prism. More specifically, the housing 498 has a first side 497 that is concave and a second side 499 that is concave. In other embodiments, the housing 498 may have a shape such as rectangular, trapezoid, elliptical, semi-circular, and variable, that fits within the void described by the triangular prism. In the embodiment of FIG. 10, the reusable battery indicator 440 is mounted between the battery cells 410 and within a battery receptacle 495 of an electronic device 500.

Figure 11:
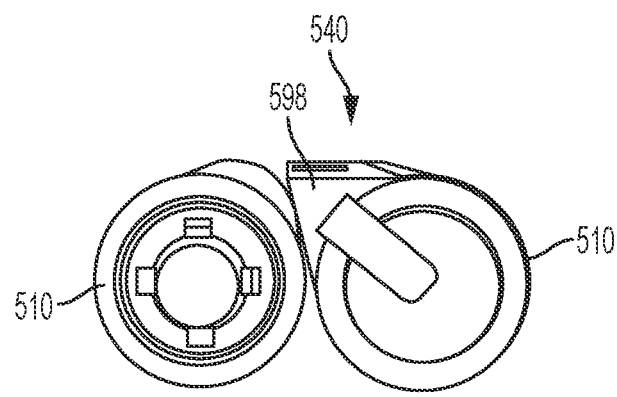
FIG. 11 is an end view of a seventh embodiment of a reusable battery indicator that is attached to one cell of a pair of battery cells.

Turning now to FIG. 11, a seventh embodiment of a reusable battery indicator 540 is illustrated and located between two battery cells 510. In the embodiment of FIG. 11, the reusable battery indicator 540 includes a housing 598 that has only a single concave side.

Figure 12:
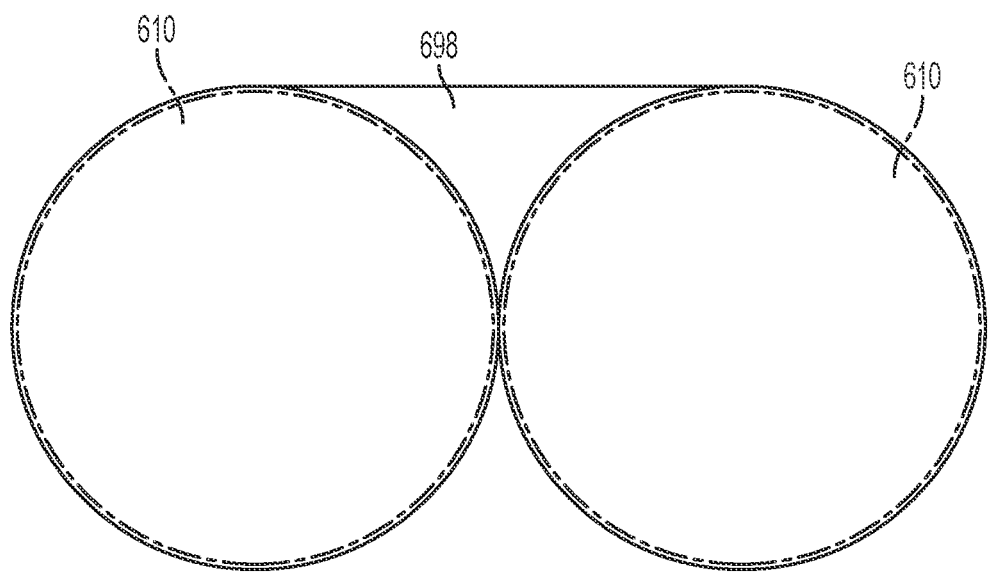
FIG. 12 is a diagram of a eighth embodiment of a reusable battery indicator that is located between two adjacent battery cells.

FIG. 12 illustrates an alternative housing shape. In this embodiment, the housing 698 is arranged to fit in the void formed by two cylindrical battery cells 610 that are arranged side by side and oriented such that the respective longitudinal axes of the battery cells 610 are parallel to one another. In the embodiment illustrated in FIG. 12, the housing 698 has a cross-sectional shape that is defined by the following equation:

$$A_v = (D_B^2 - \Pi/4 \times D_B^2)/2, \text{ where}$$

$A_v$ is the cross-sectional area of the housing 698; and
$D_B$ is a diameter of one battery cell 610.

A housing having a cross-sectional shape defined by the preceding equation maximizes the usable space between the battery cells. For example, a housing having the cross-sectional shape defined above would result in the following housing volumes for the given battery sizes (assuming that the housing length was equal to the battery cell length). For a AAA battery, the housing would have a volume of 526 mm$^3$; and for a AA battery, the housing would have a volume of 1140 mm$^3$.

Figure 13:
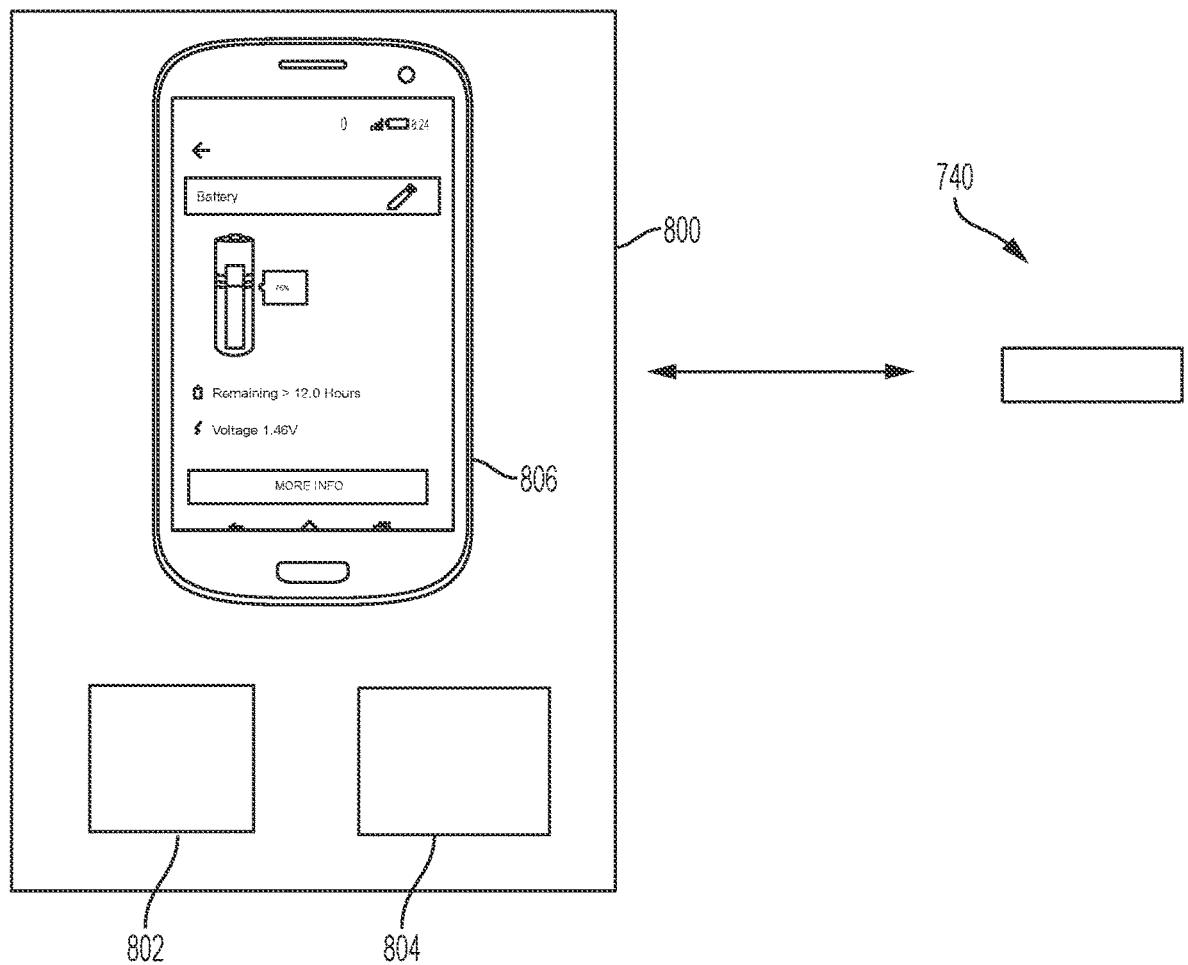
FIG. 13 is a schematic diagram of a battery indication system including the reusable battery indicator of FIG. 1.

Turning now to FIG. 13, a computing device 800 is communicatively connected to the communication circuit in the reusable battery indicator 740. The computing device receives information from the communication circuit through wireless signals sent by the antenna in the reusable battery indicator 740. For example, the wireless signal may be one or more of a wifi signal, a Bluetooth® signal, a RFID signal, or any other wireless signal. In other embodiments, the computing device 800 and the reusable battery indicator 740 may communicatively connected by a wired connection.

The computing device 800 includes a processor 802 and a memory 804. The memory 804 may store processor executable instructions that when executed by the processor 802 cause the processor 802 to detect a wireless communication signal from the reusable battery indicator 740. In some embodiments the memory 804 may comprise a non-transitory computer readable medium with the processor executable instructions embedded thereon as an article of manufacture. The processor executable instructions may also cause the processor 802 to send wireless signals back to the reusable battery indicator 740 to remotely control battery circuitry through the reusable battery indicator 740. In this manner, the processor 802 may cause the reusable battery indicator 740 to determine battery characteristic data; and to send the battery characteristic data to a user interface, such as a display 806 on the computing device 800.

In some embodiments, the battery characteristic data may comprise at least one of an electrical capacity; a voltage; an impedance, a temperature, a current; an age, a charge/discharge cycle count, and a coulomb count.

In other embodiments, the processor executable instructions, when executed by the processor 802, causes the processor 802 to determine at least one of a battery type, a physical location of the battery, and an electrical device that the battery is powering by communicating with the reusable battery indicator 740.

Figure 14A:
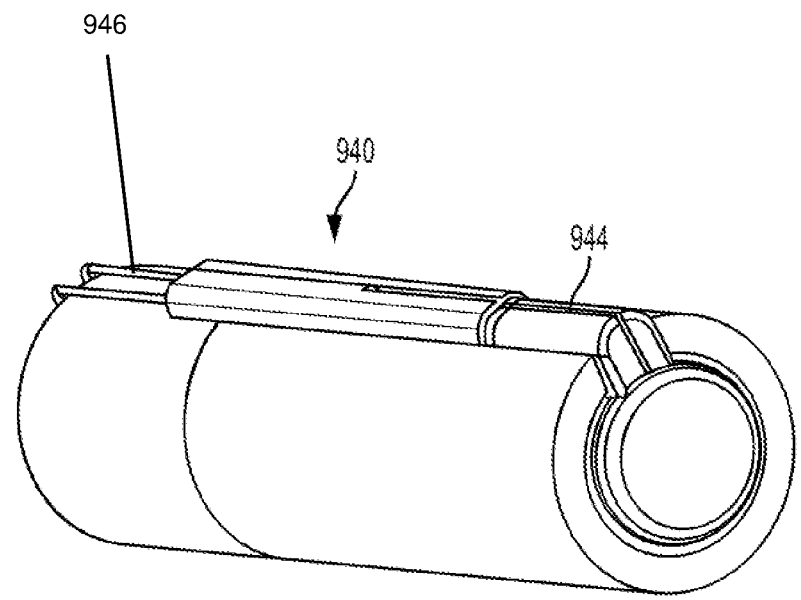
FIG. 14A is a perspective view of a ninth embodiment reusable battery indicator and a battery cell.
Figure 14B:
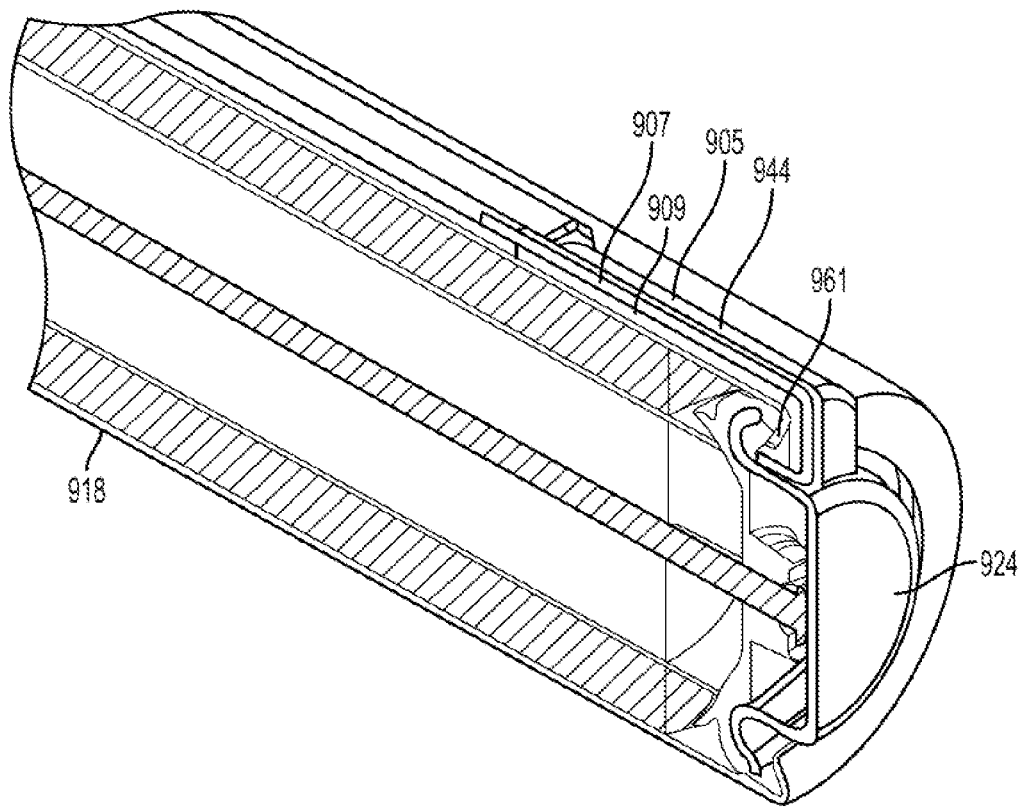
FIG. 14B is side cross-sectional view of the reusable battery indicator and battery cell of FIG. 14A.

Turning now to FIGS. 14A and 14B, yet another embodiment of a reusable battery indicator 940 is illustrated. The reusable battery indicator 940 includes a first connector 944 and a second connector 946. The first connector 944 connects to the negative terminal 924 of the battery 910 and the second connector 946 connects to the positive terminal of the battery 910. The first connector 944 includes an insulated leg 905 with an embedded wire 907. The insulated leg 905 includes an inner portion 909 that prevents the embedded wirer 907 from making contact with the crimped wall 961 of the battery housing 918. However, the embedded wire 907 is exposed at a radially inward end of the insulated leg 905 so that the embedded wire 907 may make electrical contact with the negative terminal 924, thus completing the electrical connection.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A reusable battery indicator comprising:
   a voltage sensor configured to convert sensed analog characteristics of a battery to digital information;
   a communication circuit communicatively connected to the voltage sensor;
   an antenna operatively coupled to the communication circuit; and
   a connection mechanism having at least a first connector and a second connector that are electrically connected to the voltage sensor, the first connector and the second connector being adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal,
   wherein the first connector comprises a first magnet and the second connector comprises a second magnet.

2. The reusable battery indicator of claim 1, further comprising a voltage booster electrically connected to the voltage sensor.

3. The reusable battery indicator of claim 1, wherein at least one of the first connector and the second connector further comprises a cup.

4. The reusable battery indicator of claim 1, wherein at least one of the first connector and the second connector comprises at least one metal and at least one insulator.

5. The reusable battery indicator of claim 1, wherein at least one of the first connector and the second connector comprises at least one of a metal, a metal alloy, cold-rolled steel, hard drawn ferrous and non-ferrous alloys, high and low carbon steel alloys, post or pre-plated ferrous and non-ferrous alloys, or any combination thereof.

6. The reusable battery indicator of claim 1, wherein the communication circuit comprises Wi-Fi circuitry.

7. The reusable battery indicator of claim 1, wherein the voltage sensor reads an open circuit voltage of less than 1.8 Volts.

8. The reusable battery indicator of claim 1, wherein the voltage sensor and the communication circuit are formed on a printed circuit board that is disposed between the first connector and the second connector.

9. The reusable battery indicator of claim 1, wherein the first magnet provides retention force between the first connector and the first battery terminal and the second magnet provides retention force between the second connector and the second battery terminal.

10. The reusable battery indicator of claim 1, wherein the first connector and the second connector comprise conductive magnets.

11. The reusable battery indicator of claim 1, further comprising a housing, the voltage sensor, and the communication circuit being mounted within the housing, the housing being sized and shaped to fit between two cylindrical batteries that are arranged longitudinally side-by-side.

12. The reusable battery indicator of claim 11, wherein the housing has a cross-section that is in a shape of a triangular prism.

13. The reusable battery indicator of claim 12, wherein the housing has one side that is concave.

14. The reusable battery indicator of claim 12, wherein the housing has two sides that are concave.

15. The reusable battery indicator of claim 1, wherein the voltage sensor is one of a thin disc BLE, UHF, or RF circuitry.

16. An electronic device comprising the reusable battery indicator of claim 1, wherein a housing of the reusable battery indicator is mounted within a battery receptacle of an electronic device.

17. A remote battery indication system, the system comprising:
   a battery; and
   a reusable battery indicator, the battery indicator including a voltage sensor that converts sensed analog characteristics of a battery to digital information; a communication circuit communicatively connected to the voltage sensor; an antenna operatively coupled to the communication circuit; and a connection mechanism having at least a first connector and a second connector that are electrically connected to the voltage sensor, the first connector and the second connector being adapted to be removably connected to a first battery terminal and to a second battery terminal, respectively, thereby completing an electrical circuit between the voltage sensor and the first and second battery terminals when the connection mechanism is coupled to the first battery terminal and to the second battery terminal,
   wherein the first connector comprises a first magnet and the second connector comprises a second magnet, and the first connector and the second connector are electrically attached to a first battery terminal and a second battery terminal, respectively, so that the voltage sensor senses a characteristic of the battery.

18. The system of claim 17, further comprising a computing device that is communicatively connected to the communication circuit, the computing device receiving information from the communication circuit through the antenna.

19. The system of claim 18, wherein the computing device includes a processor and a memory, the memory storing a software routine that causes the processor to detect a wireless communication signal from the reusable battery indicator, to remotely control battery circuitry through the reusable battery indicator to determine battery characteristic data; and to send the battery characteristic data to a user interface.

20. The system of claim 19, wherein the battery characteristic data comprises at least one of an electrical capacity; a voltage; an impedance, a temperature, a current; an age, a charge/discharge cycle count, and a coulomb count.

21. The system of claim 19, wherein the software routine, when executed by the processor, causes the processor to determine at least one of a battery type, a physical location of the battery, and an electrical device that the battery is powering.

* * * * *